United States Patent [19]

Ishii

[11] Patent Number: 5,574,702
[45] Date of Patent: Nov. 12, 1996

[54] MAGNETIC HEAD CURRENT CONTROL CIRCUIT FOR USE IN A MAGNETIC HEAD DRIVE DEVICE, AND MAGNETIC/MAGNETOOPTICAL RECORDING APPARATUS USING THE SAME

[75] Inventor: Kazuyoshi Ishii, Tokyo, Japan

[73] Assignee: Canon Kabushiki Kaisha, Tokyo, Japan

[21] Appl. No.: 286,331

[22] Filed: Aug. 5, 1994

[30] Foreign Application Priority Data

Aug. 6, 1993 [JP] Japan .................................. 5-213550

[51] Int. Cl.$^6$ ............................................... G11B 11/00
[52] U.S. Cl. ................................ 369/13; 360/114; 360/46
[58] Field of Search ............................ 369/13, 102, 103; 360/114, 46, 67, 68, 59; 365/122

[56] References Cited

U.S. PATENT DOCUMENTS

| | | | |
|---|---|---|---|
| 5,351,155 | 9/1994 | Ishii | 360/46 |
| 5,359,466 | 10/1994 | Fuji et al. | 360/46 |
| 5,377,055 | 12/1994 | Ishii | 360/46 |
| 5,377,172 | 12/1994 | Hino et al. | 369/13 |
| 5,394,380 | 2/1995 | Hasegawa | 369/13 |

FOREIGN PATENT DOCUMENTS

| | | |
|---|---|---|
| 0550267 | 7/1993 | European Pat. Off. . |
| 63-94406 | 4/1988 | Japan . |
| WO91-03104 | 3/1991 | WIPO . |
| WO92-01285 | 1/1992 | WIPO . |

OTHER PUBLICATIONS

Patent Abstracts of Japan, Kokai No. 63–244402, vol. 13, No. 54, Feb. 1989.
Patent Abstracts of Japan, Kokai No. 5–174309, vol. 17, No. 590, Oct. 1993.

*Primary Examiner*—Tan Dinh
*Attorney, Agent, or Firm*—Fitzpatrick, Cella, Harper & Scinto

[57] ABSTRACT

A magnetic head drive device includes a pair of auxiliary coils, a pair of switch elements respectively connected in series with the pair of auxiliary coils, and a magnetic head. The magnetic head is arranged between a node of the pair of auxiliary coils and the pair of switch elements. The switch elements are driven by control of a switch element drive device such that at least one of the pair of switch elements is maintained in an ON state for a predetermined period of time upon completion or interruption of information recording by the magnetic head. A current contol device is further provided so as to gradually decrease a current to be supplied to the pair of auxiliary coils during the ON state.

15 Claims, 12 Drawing Sheets

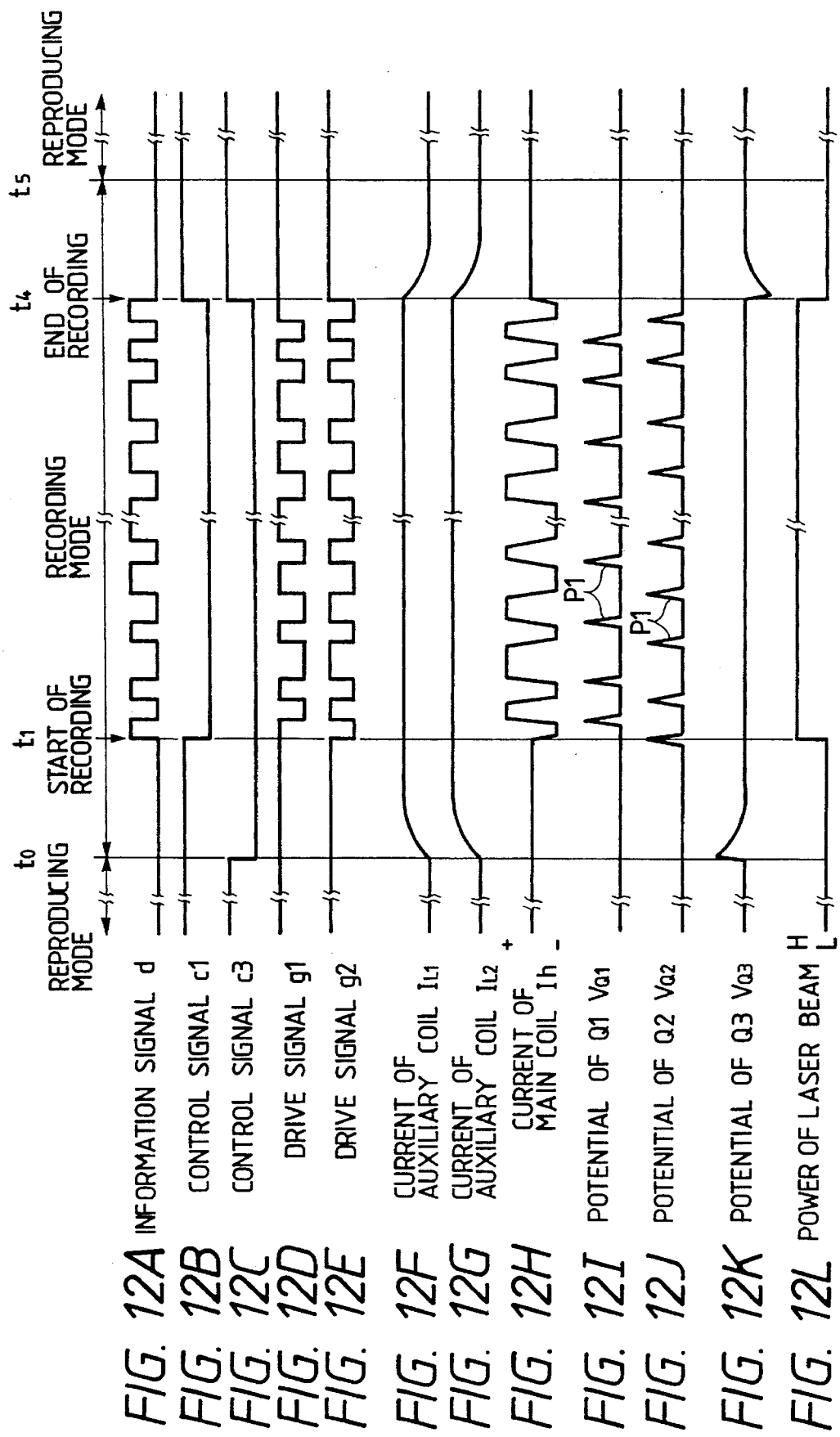

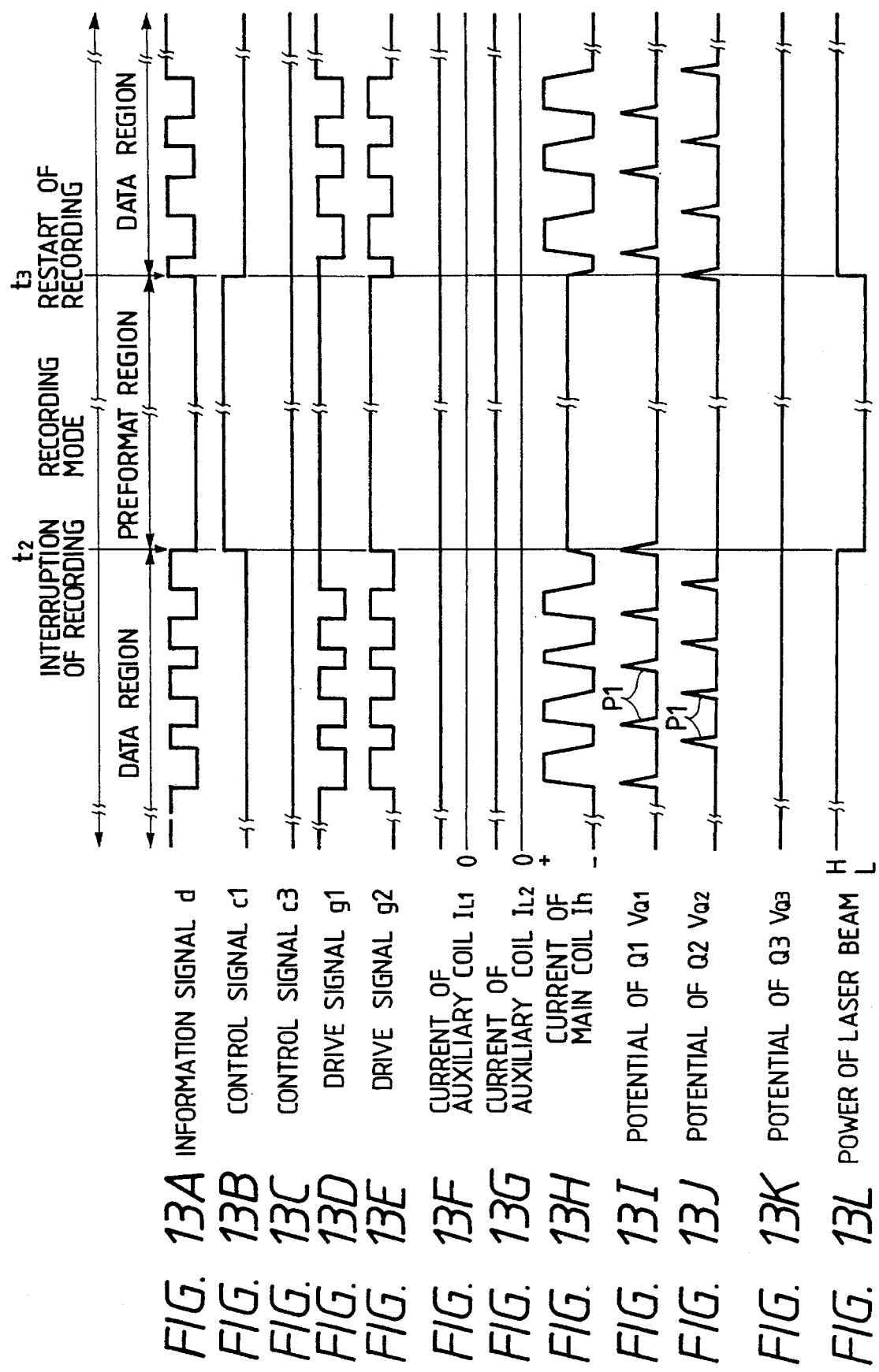

MAGNETIC HEAD CURRENT CONTROL CIRCUIT FOR USE IN A MAGNETIC HEAD DRIVE DEVICE, AND MAGNETIC/MAGNETOOPTICAL RECORDING APPARATUS USING THE SAME

BACKGROUND OF THE INVENTION

1. Field of the Invention

The present invention relates to a magnetic head drive device for modulating the magnetic field of a magnetic head in accordance with an information signal to be recorded, and a magnetic recording apparatus for recording information on a recording medium using the magnetic head drive device.

2. Related Background Art

As a recording method of a conventional magnetooptical recording apparatus, an optical modulation method, a magnetic field modulation method, and the like are known. In particular, the magnetic field modulation method which can directly overwrite new data on old data is advantageous in terms of the recording speed, and the like. FIG. 1 is a schematic view showing the arrangement of a magnetooptical recording apparatus adopting the magnetic field modulation method. Referring to FIG. 1, a magnetooptical disk 1 as an information recording medium has a magnetooptical recording layer 1a, and is rotated by a motor 5. A magnetic head 2 which has an excitation coil Lh wound around a magnetic core is arranged above the upper surface of the magnetooptical disk 1, and an optical head 4 is arranged below the lower surface of the disk 1 to oppose the magnetic head 2.

When an information signal is recorded, a current is supplied from a laser drive circuit 7 to a semiconductor laser 6 arranged inside the optical head 4 as a light source, and a high-power laser beam is irradiated as a very small beam spot onto the recording layer 1a of the rotating magnetooptical disk 1, thereby raising the temperature of the recording portion to a temperature equal to or higher than the Curie temperature of the recording layer. On the other hand, the magnetic head 2 is driven by a drive device 3 to generate a bias magnetic field which is modulated in correspondence with information to be recorded, and applies the generated magnetic field to the temperature raised portion of the recording layer 1a. Then, the direction of magnetization of the temperature raised portion on the recording layer 1a aligns in the direction of the bias magnetic field, and an information mark is recorded on the recording layer 1a. When the recorded information signal is reproduced, the laser drive circuit 7 supplies a current smaller than that in the recording mode to the semiconductor laser 6, and a low-power laser beam is irradiated as a very small beam spot onto the recording layer 1a. Then, a sensor detects rotation of the plane of polarization of reflected light due to the recorded magnetization.

Recently, in order to record information at higher density, the recording method is shifting from the mark position recording method which assigns a meaning to information at the central position of a mark to the mark edge recording method which assigns a meaning to information at the edge position of a mark. In the mark edge recording method, the edge of an information mark must be clearly recorded, and for this purpose, the reversing speed of the bias magnetic field applied from the magnetic head in the recording mode must be increased.

As a drive device for a magnetic head, which satisfies the above-mentioned requirements, a device disclosed in, e.g., Japanese Laid-Open Patent Application No. 63-94406 is known. FIG. 2 is a circuit diagram showing this drive device. Referring to FIG. 2, the excitation coil Lh generates a bias magnetic field for the magnetic head 2, and auxiliary coils L1 and L2 are used for switching the direction of the magnetic field at high speed. Switch elements S1 and S2 are used for switching the direction of a current to be supplied to the excitation coil Lh, and current sources IS1 and IS2 are respectively connected to the auxiliary coils L1 and L2. The inductances of the auxiliary coils L1 and L2 are set to be sufficiently larger than that of the excitation main coil Lh. In this drive device, the direction of a current to be supplied to the excitation main coil Lh is switched by controlling the switch elements S1 and S2 to be alternately turned on, thereby switching the polarity of the generated magnetic field in correspondence with information to be recorded.

More specifically, when the switch element S1 is ON and the switch element S2 is OFF, current paths CH1 and CH4 are rendered conductive, and current paths CH2 and CH3 indicated by broken lines are rendered nonconductive. At this time, since a current is supplied to the excitation main coil Lh upon conduction of the current path CH1, the coil Lh generates a magnetic field corresponding to the direction of the supplied current. On the other hand, when the switch element S1 is OFF and the switch element S2 is ON, the current paths CH2 and CH3 are rendered conductive, and the current paths CH1 and CH4 are rendered nonconductive. As a result, a current in a direction opposite to that described above is supplied to the excitation main coil Lh upon conduction of the current path CH2, and the coil Lh generates a magnetic field having an inverted polarity. In this case, since the inductances of the auxiliary coils L1 and L2 are sufficiently larger than that of the excitation main coil Lh, a current to be supplied maintains an almost constant value although the current paths change from CH1 to CH3 and from CH4 to CH2 before and after the ON/OFF operations of the switch elements S1 and S2. For this reason, if the ON/OFF times of the switch elements S1 and S2 are set to be sufficiently short, the direction of the current flowing through the excitation main coil Lh can be reversed within a very short period of time.

On the other hand, when the recorded information signal is reproduced, the optical head 4 irradiates a laser beam having a lower intensity than that in the recording mode onto the recording layer 1a of the rotating magnetooptical disk 1, and the information signal is reproduced on the basis of reflected light by utilizing a Kerr effect of an information mark. In this case, both the switch elements S1 and S2 of the magnetic head drive device are turned off to stop the drive operation of the main coil Lh.

However, in the conventional magnetic head drive circuit described above, when both the switch elements S1 and S2 are turned off upon completion of recording, a large counter electromotive voltage is generated in the auxiliary coils L1 and L2. For this reason, the switch elements S1 and S2 may be destroyed. The problem associated with element destruction will be described below with reference to FIGS. 3A to 3G. FIG. 3A shows a binary information signal to be recorded, and FIGS. 3B and 3C show the ON/OFF states of the switch elements S1 and S2, respectively. In FIGS. 3B and 3C, a high level corresponds to the ON state, and a low level corresponds to the OFF state. The switch elements S1 and S2 are alternately turned on/off in correspondence with an information signal, as shown in FIGS. 3B and 3C, thereby generating a magnetic field modulated in correspondence with the information signal by alternately switching the direction of the current to the main coil Lh, as shown in FIG. 3D. During reproduction, both the switch elements S1 and S2 are OFF, and the drive operation of the main coil Lh is stopped. FIG. 3G shows the power of a laser beam irradiated onto the recording layer 1a. During the recording operation, a high-power laser beam is irradiated, and the laser power is switched to low power simultaneously when the recording operation is finished and the reproducing operation is started.

FIGS. 3E and 3F show the potentials at a node (a node Q1 in FIG. 2) between the switch element S1 and the auxiliary coil L2, and a node (a node Q2) between the switch element S2 and the auxiliary coil L1. During the recording operation of information, as shown in FIGS. 3E and 3F, immediately after the switch elements S1 and S2 are turned off, voltage pulses P1 are generated by the counter electromotive forces from the auxiliary coils L2 and L1. These voltage pulses P1 are inevitably generated when the switching time of the current direction of the main coil Lh is shortened, and normally have a crest value of about several tens of volts. More specifically, during the recording operation, one of the switch elements S1 and S2 is ON, and the current paths of the auxiliary coils L1 and L2 are not rendered nonconductive. For this reason, currents of the auxiliary coils L1 and L2 do not abruptly decrease and do not generate voltage pulses exceeding several tens of volts. For this reason, when a transistor is used as the switch element, a transistor which has a rated maximum withstanding voltage of about 100 V can be selected so as not to be destroyed by the above-mentioned voltage pulses P1.

However, when the recording operation is finished and both the switch elements S1 and S2 are turned off, since the current paths of the auxiliary coils L1 and L2 are forcibly rendered nonconductive, currents of the auxiliary coils L1 and L2 abruptly decrease. For this reason, as shown in FIGS. 3E and 3F, when the switch elements S1 and S2 are turned off, voltage pulses P2 larger than the voltage pulses P1 during the recording operation are generated by the counter electromotive forces from the auxiliary coils L1 and L2. Such a voltage pulse P2 has a considerably larger crest value than that of the voltage pulse P1 during the recording operation, and sometimes reaches several hundreds of volts exceeding the rated maximum withstanding voltage of the switch element. Therefore, when a high voltage exceeding the rated maximum withstanding voltage of the switch element is applied to the switch element, the switch element may be destroyed.

In particular, in a recording medium which is formatted to have preformat regions for reproduction only, in which sector marks and address information are recorded in units of sectors, and data regions for recording data, since the recording operation is temporarily stopped on the preformat regions, if information is continuously recorded on a plurality of sectors, the above-mentioned large voltage pulse P2 is repetitively generated, and the switch elements are more easily destroyed. As described above, in recent years, the recording method is shifting from the mark position recording method to the mark edge recording method. In the mark edge recording method, it is required to shorten the current inversion time of the main coil of the magnetic head, and to shorten the reversal time of the magnetic field to be applied to the recording medium. However, since the voltage pulse P2 becomes higher as the switching time from the ON to OFF state of the switch element becomes shorter, the voltage pulse P2 becomes still higher in the magnetic head drive circuit for the mark edge recording method. In order to solve these problems, elements with a high withstanding voltage can be used. However, such a switch element with a high withstanding voltage has a large ON resistance, and increases power consumption of the drive circuit, thus posing another problem. For this reason, the switch element with a high withstanding voltage is not an effective solution.

SUMMARY OF THE INVENTION

The present invention has been made in consideration of the conventional problems, and has as its object to provide a magnetic head drive device which can prevent switch elements from being destroyed by suppressing overvoltages of the auxiliary coils to be applied to the switch elements upon completion of information recording, and a magnetic recording apparatus using the same.

In order to achieve the above object, there is provided a magnetic head drive device which has a pair of auxiliary coils, a pair of switch elements respectively connected in series with the pair of auxiliary coils, and switch element drive means, and which switches the direction of a drive current of a magnetic head arranged between nodes of the pair of auxiliary coils and the pair of switch elements in correspondence with an information signal by alternately turning on the pair of switch elements in correspondence with the information signal, wherein the switch element drive means controls to maintain at least one of the pair of switch elements in an ON state for a predetermined period of time upon completion or interruption of information recording, and the device comprises current control means for gradually decreasing a current to be supplied to the pair of auxiliary coils while the switch element is in the ON state.

In order to achieve the above object, there is also provided a magnetic recording apparatus, which has a magnetic head arranged near a surface of a recording medium, and a magnetic head drive circuit which is constituted by a pair of auxiliary coils for driving the magnetic head, a pair of switch elements respectively connected in series with the pair of auxiliary coils, and switch element drive means, and modulates a magnetic field generated by the magnetic head in correspondence with an information signal to be recorded by switching a current direction of the magnetic head by alternately turning on the pair of switch elements in correspondence with the information signal, and which apparatus records information by applying the modulated magnetic field of the magnetic head to the recording medium, wherein the switch element drive means is controlled to maintain at least one of the pair of switch elements in an ON state for a predetermined period of time upon completion or interruption of information recording, and the apparatus comprises current control means for gradually decreasing a current to be supplied to the pair of auxiliary coils while the switch element is in the ON state.

In order to achieve the above object, there is also provided a magnetic head drive device which has a pair of auxiliary coils and a pair of switch elements respectively connected in series with the pair of auxiliary coils, and switches the direction of a drive current of a magnetic head arranged between nodes of the pair of auxiliary coils and the pair of switch elements in correspondence with an information signal by alternately turning on the pair of switch elements in correspondence with the information signal, comprising switch element drive means for driving the pair of switch elements, and clamp means for clamping voltages to be applied to the pair of switch elements by counter electromotive forces from the pair of auxiliary coils, wherein the pair of switch elements are turned off by the switch element drive means upon completion or interruption of information recording, and voltages, based on the counter electromotive forces of the auxiliary coils, to be applied to the switch elements due to the OFF operation of the pair of switch elements are clamped by the clamp means.

In order to achieve the above object, there is also provided a magnetic recording apparatus, which has a magnetic head arranged near a surface of a recording medium, and a magnetic head drive circuit which is constituted by a pair of auxiliary coils for driving the magnetic head and a pair of switch elements respectively connected in series with the pair of auxiliary coils, and modulates a magnetic field generated by the magnetic head in correspondence with an information signal to be recorded by switching a current direction of the magnetic head by alternately turning on the pair of switch elements in correspondence with the information signal, and which apparatus records information by applying the modulated magnetic field of the magnetic head to the recording medium, comprising switch element drive means for driving the pair of switch elements, and clamp means for clamping voltages to be applied to the pair of switch elements due to counter electromotive forces from the pair of auxiliary coils, wherein the pair of switch elements are turned off by the switch element drive means upon completion or interruption of information recording, and voltages, based on the counter electromotive forces of the auxiliary coils, to be applied to the switch elements due to the OFF operation of the pair of switch elements are clamped by the clamp means.

In order to achieve the above object, there is also provided a magnetic head drive device which has a pair of auxiliary coils, a pair of switch elements respectively connected in series with the pair of auxiliary coils, and switch element drive means, and switches the direction of a drive current of a magnetic head arranged between nodes of the pair of auxiliary coils and the pair of switch elements in correspondence with an information signal by alternately turning on the pair of switch elements in correspondence with the information signal, comprising current control means for controlling the switch element drive means to maintain at least one of the pair of switch elements in an ON state in a state other than an information recording state, and gradually decreasing a current to be supplied to the pair of auxiliary coils upon completion or interruption of information recording.

In order to achieve the above object, there is also provided a magnetic recording apparatus, which has a magnetic head arranged near a surface of a recording medium, and a magnetic head drive circuit which is constituted by a pair of auxiliary coils for driving the magnetic head, a pair of switch elements respectively connected in series with the pair of auxiliary coils, and switch element drive means, and modulates a magnetic field generated by the magnetic head in correspondence with an information signal to be recorded by switching a current direction of the magnetic head by alternately turning on the pair of switch elements in correspondence with the information signal, and which apparatus records information by applying the modulated magnetic field of the magnetic head to the recording medium, comprising current control means for controlling the switch element drive means to maintain at least one of the pair of switch elements in an ON state in a state other than an information recording state, and gradually decreasing a current to be supplied to the pair of auxiliary coils upon completion or interruption of information recording.

BRIEF DESCRIPTION OF THE DRAWINGS

FIGS. 12A to 12L are timing charts showing the operations in a reproducing mode and a recording mode in the embodiment shown in FIG. 11; and FIGS. 13A to 13L are timing charts showing the operations on a data region and a preformat region in the embodiment shown in FIG. 11.

DETAILED DESCRIPTION OF THE PREFERRED EMBODIMENTS

Figure 1:
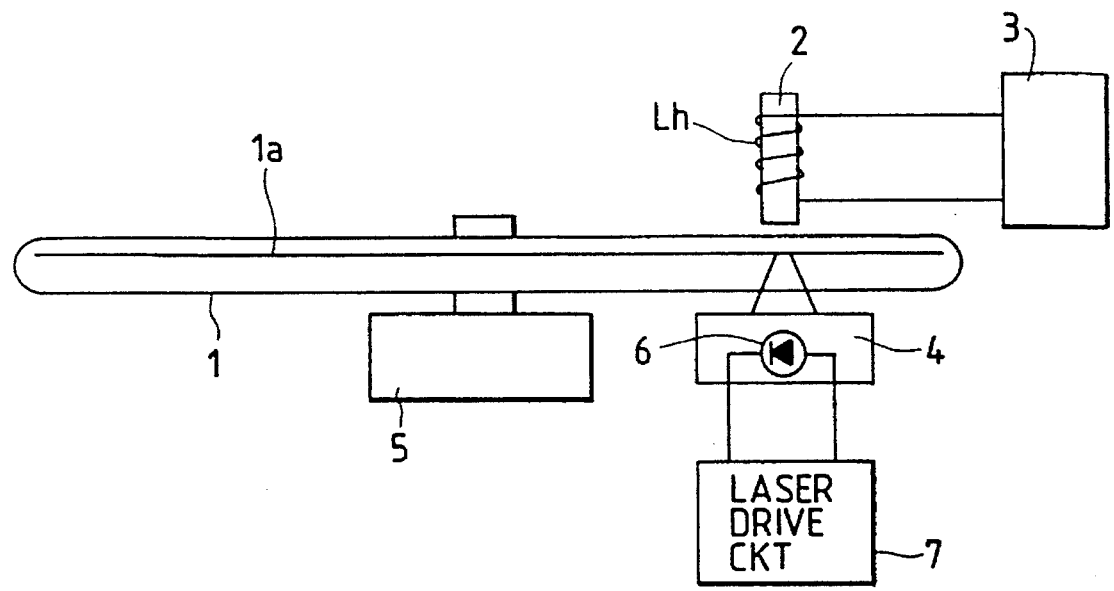
FIG. 1 is a schematic view showing the arrangement of a magnetooptical recording apparatus adopting a magnetic field modulation method.
Figure 2:
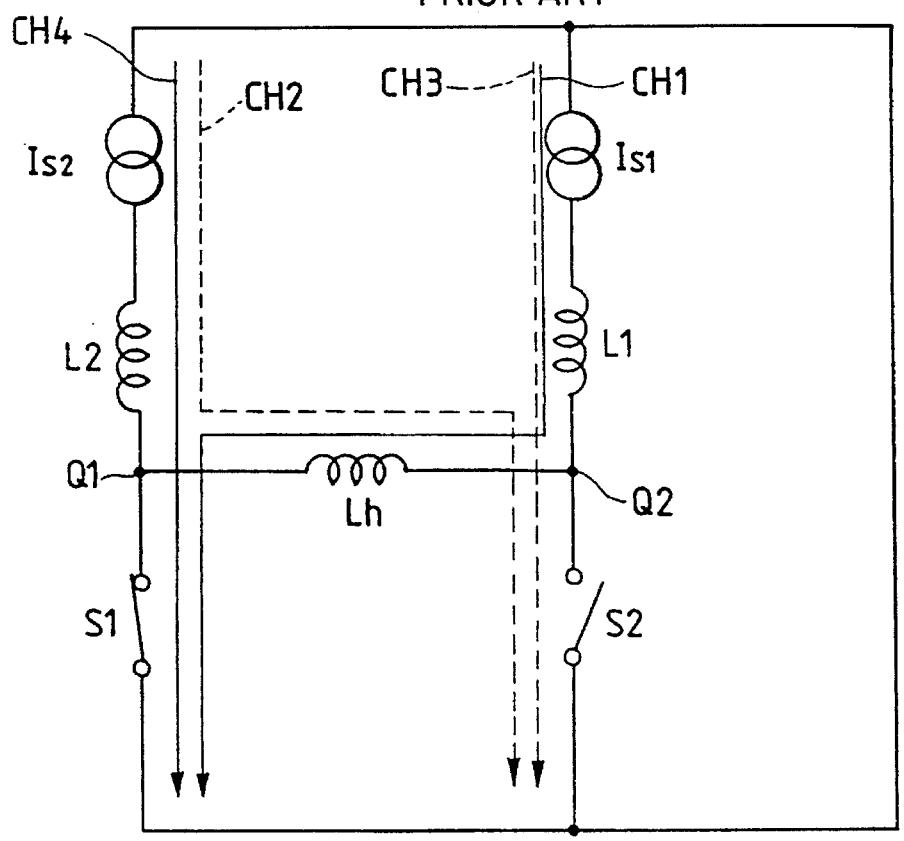
FIG. 2 is a circuit diagram showing an example of a magnetic head drive circuit used in the magnetooptical recording apparatus shown in FIG. 1.
Figure 3:
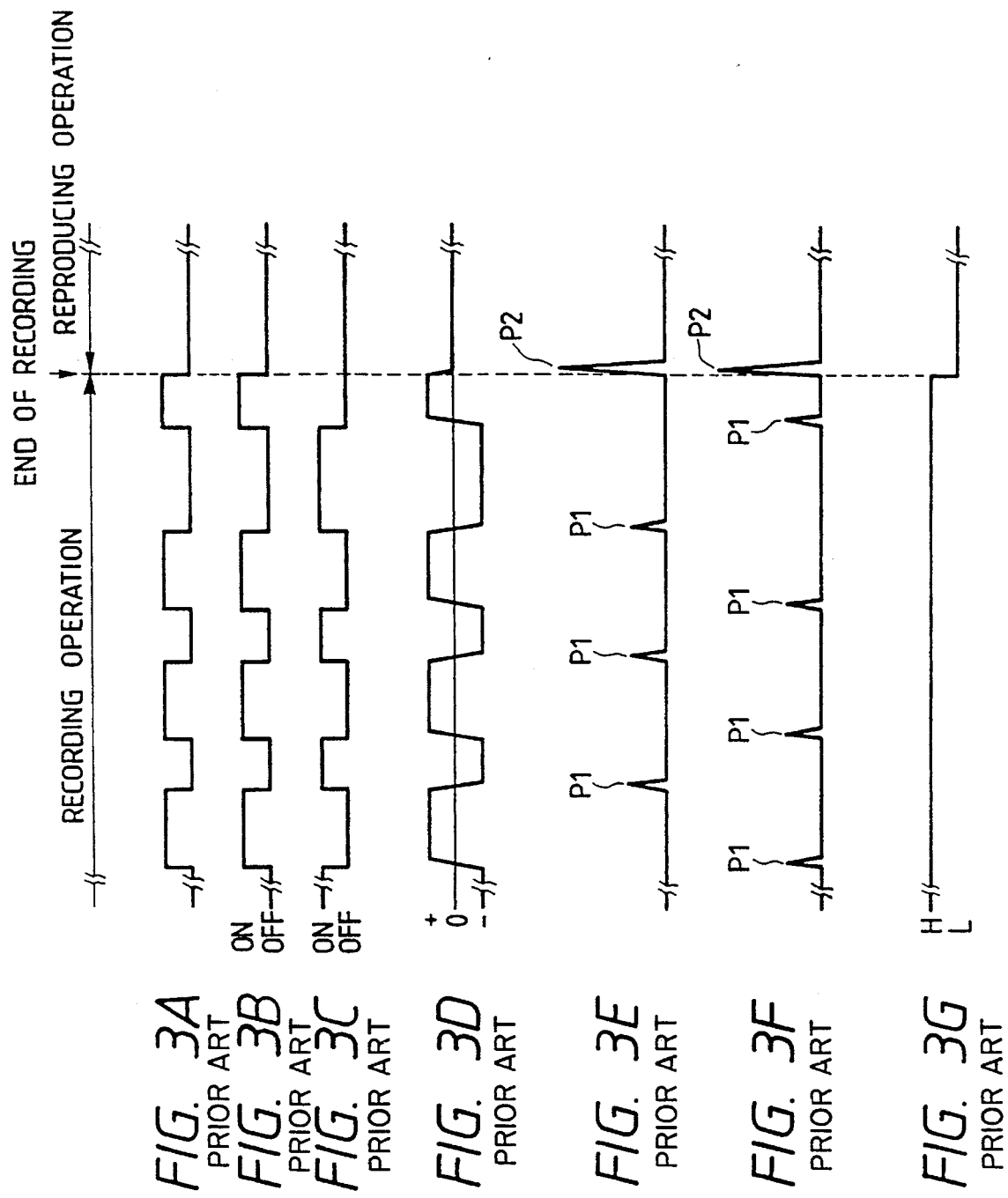
FIGS. 3A to 3G are timing charts showing the operations of the magnetic head drive circuit shown in FIG. 2.
Figure 4:
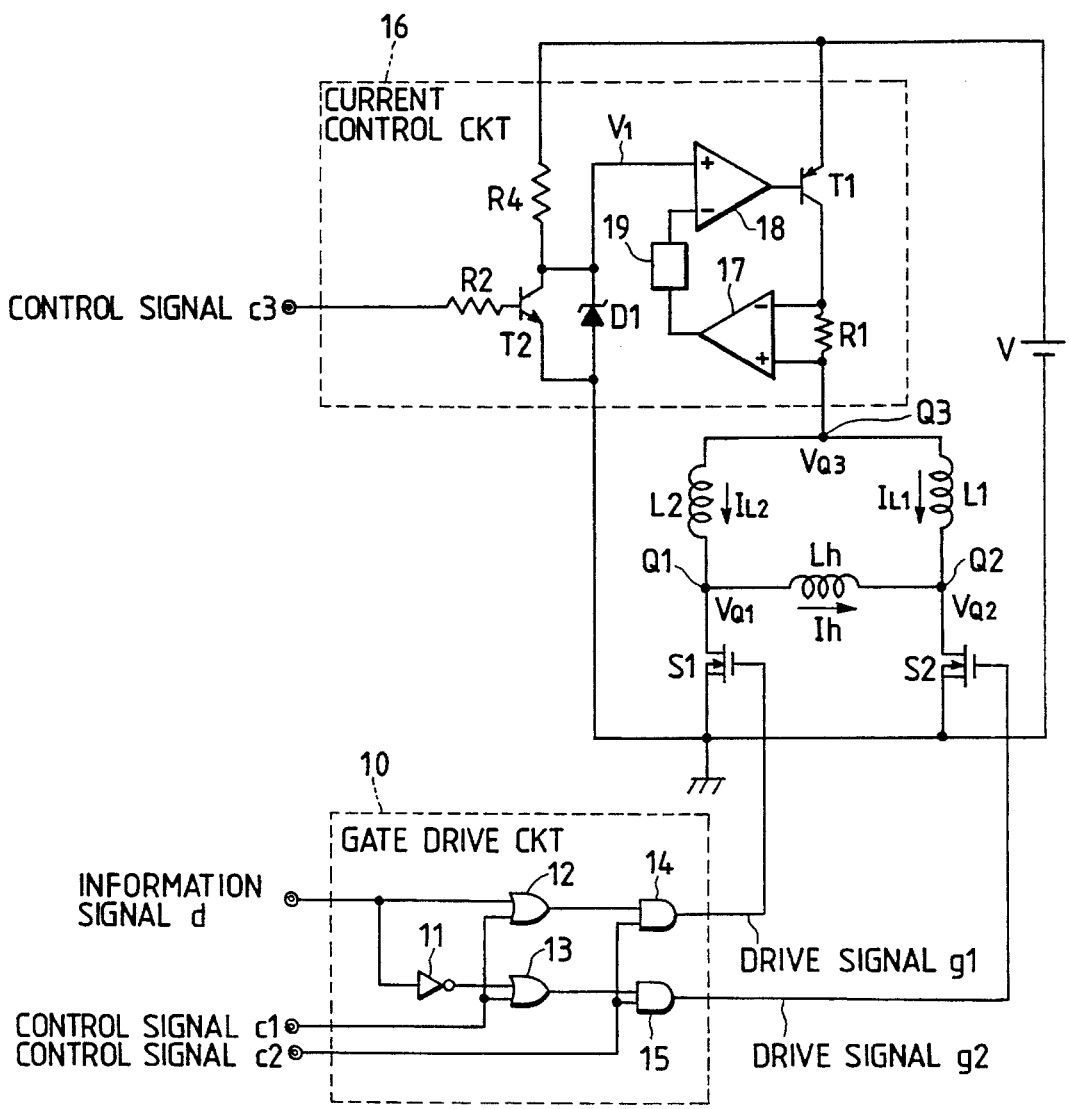
FIG. 4 is a circuit diagram showing the first embodiment of a magnetic head drive device according to the present invention.

The preferred embodiments of the present invention will be described in detail hereinafter with reference to the accompanying drawings. FIG. 4 is a circuit diagram showing the first embodiment of a magnetic head drive device according to the present invention. Note that the same reference numerals in FIG. 4 denote the same parts as in the conventional device shown in FIG. 2. Referring to FIG. 4, a main coil Lh is wound around the outer surface of a magnetic core, as shown in FIG. 1. The magnetic core and the main coil Lh wound around the magnetic core are arranged as a magnetic head near the surface of a magnetooptical disk 1. Auxiliary coils L1 and L2 are connected between the main coil and a DC power supply V, and switch elements S1 and S2 are respectively connected in series with the auxiliary coils L2 and L1. In this embodiment, the switch elements S1 and S2 comprise FETs (field effect transistors). The auxiliary coils L1 and L2 and the switch elements S1 and S2 constitute a drive circuit for driving the magnetic head in correspondence with an information signal.

A gate drive circuit 10 generates drive signals g1 and g2 to be applied to the gates of the switch elements S1 and S2 on the basis of an information signal d supplied from a controller (not shown). The gate drive circuit 10 is constituted by an inverting gate 11, OR gates 12 and 13, and AND gates 14 and 15. The circuit 10 generates the drive signal g1 which is in-phase with the input information signal, and the drive signal g2 which has a phase opposite to that of the drive signal g1, on the basis of the input information signal, and applies these signals to the gates of the switch elements S1 and S2. The operation of the gate drive circuit 10 is controlled by two control signals C1 and C2 supplied from the controller. The control signal C1 is a signal input to one terminal of each of the OR gates 12 and 13, and is a signal for permitting or inhibiting information recording. When the control signal C1 is at low level, information recording is permitted, and the gate drive circuit 10 generates the drive signals. The control signal C2 is a signal input to one terminal of each of the AND gates 14 and 15, and is a signal for instructing an operation mode of the device. In a recording mode, the control signal C2 goes to high level, and in other modes including a reproducing mode, the control signal C2 goes to low level.

A current control circuit 16 controls a current to be supplied from the DC power supply V to the magnetic head drive circuit to be a predetermined constant current, and controls a current to be supplied to the magnetic head drive circuit to suppress generation of the above-mentioned voltage pulses upon completion of information recording. The current control circuit 16 comprises a resistor R1 for detecting a current, a differential amplifier 17 for detecting a current of the resistor R1 as a voltage across its two terminals, a differential amplifier 18 for comparing the output voltage from the differential amplifier 17 with a reference voltage V1 from a Zener diode D1 and outputting a control signal corresponding to the difference between the two voltages, and a transistor T1 controlled by the output signal from the differential amplifier 18. As will be described in detail later, in an information recording mode, the Zener diode D1 breaks down, the differential amplifier 18 compares the reference voltage V1 from the Zener diode D1 and the output voltage from the differential amplifier 17 to generate an output signal corresponding to the difference between the two voltages, and the output signal is input to the base of the transistor T1.

The reference voltage V1 of the Zener diode D1 is set in correspondence with a target value of a current to be supplied to the magnetic head drive circuit. When the current to be supplied increases beyond the target value due to any cause, the difference signal from the differential amplifier 18 increases, and control acts to decrease the current of the transistor T1. On the other hand, when the current to be supplied decreases below the target value, the difference signal from the differential amplifier 18 decreases, and feedback control is made to increase the current of the transistor T1. In this manner, the current to be supplied from the DC power supply V to the auxiliary coils L1 and L2 in the magnetic head drive circuit is controlled to a predetermined constant current by controlling the transistor T1.

The current control circuit 16 also comprises a transistor T2. The transistor T2 operates to control the Zener diode to break down or to forcibly short-circuit the two terminals of the Zener diode D1. The transistor T2 is controlled by a control signal C3 supplied from the controller. As will be described in detail later, in the information recording mode, since the control signal C3 is at low level and the transistor T2 is set in an OFF state, the Zener diode D1 receives a current via a resistor R4 and breaks down. Upon completion of information recording, since the control signal C3 goes to high level, the transistor T2 is turned on, and the Zener diode D1 is forcibly short-circuited. Upon this short-circuiting, since the reference voltage V1 becomes almost 0 V, the current supplied from the current control circuit 16 becomes 0, and current supply to the magnetic head stops. The above-mentioned magnetic head drive device of the first embodiment shown in FIG. 4 is mounted as a drive device for a magnetic head in the magnetooptical recording apparatus shown in FIG. 1. Also, each of the second to sixth embodiments of drive devices for a magnetic head is mounted in the magnetooptical recording apparatus shown in FIG. 1.

Figure 5:
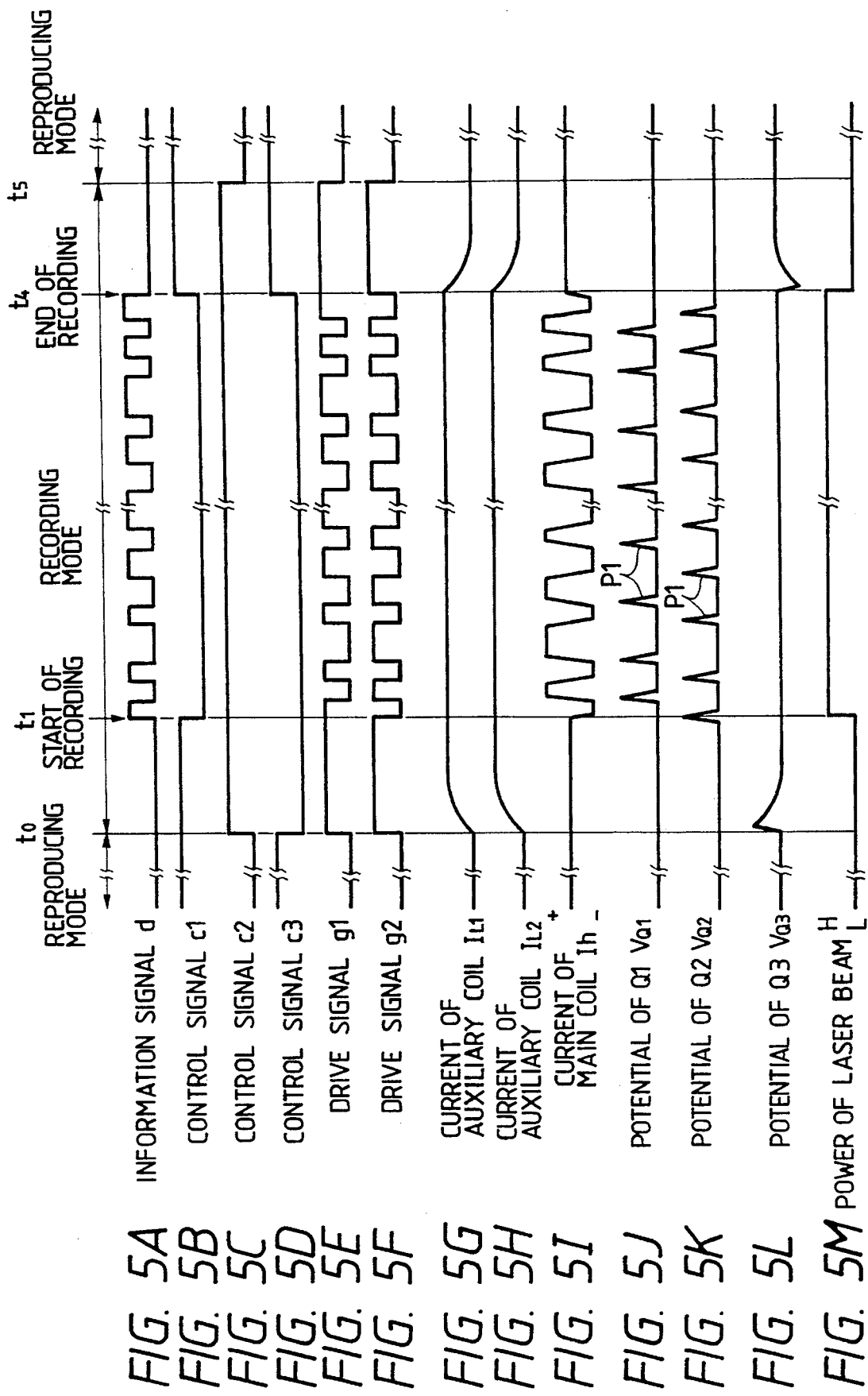
FIGS. 5A to 5M are timing charts showing the operations of the embodiment shown in FIG. 4.

The detailed operation of this embodiment will be described below with reference to FIGS. 5A to 5M. FIG. 5A shows the information signal d supplied from the controller of the magnetooptical recording apparatus to the gate drive circuit 10, FIG. 5B shows the control signal C1 supplied from the controller of the magnetooptical recording apparatus to the gate drive circuit 10, and FIG. 5C shows the control signal C2 supplied from the controller of the magnetooptical recording apparatus to the gate drive circuit 10. FIG. 5D shows the control signal C3 supplied from the controller to the current control circuit 16.

When the operation mode of the apparatus is the reproducing mode, the control signal C1 is set at high level, as shown in FIG. 5B, the control signal C2 is set at low level, as shown in FIG. 5C, and the control signal C3 is set at high level, as shown in FIG. 5D. In this reproducing mode, the operation of the current control circuit 16 is in a stop state, and hence, the drive operation of the magnetic head is in a stop state. As shown in FIG. 5M, a laser beam to be irradiated is controlled to have low power. At time $t_0$, when the operation mode is switched from the reproducing mode to the recording mode, the control signal C2 goes to high level, as shown in FIG. 5C, and the control signal C3 is inverted to low level, as shown in FIG. 5D. Also, the control signal C1 is inverted to low level at time $t_1$ a predetermined period of time after the recording mode was set, as shown in FIG. 5B, and the information signal d begins to be transferred at time $t_1$ at which the control signal C1 is inverted to low level, as shown in FIG. 5A. Therefore, before time $t_1$, the information signal is at low level, and at time $t_1$ at which the control signal C1 is inverted, the recording operation is started. As shown in FIG. 5M, the laser beam is controlled to have low power before time $t_1$, and simultaneously as the recording operation is started at time $t_1$, the laser beam is controlled to have high power.

When the operation mode is switched to the recording mode at time $t_0$, and the control signal C2 is inverted to high level, since the information signal d is at low level and the control signal C1 is at high level, both the drive voltages g1 and g2 output from the AND gates 14 and 15 of the gate drive circuit 10 go to high level, as shown in FIGS. 5E and 5F, and both the switch elements S1 and S2 are turned on. On the other hand, when the control signal C3 goes to low level at time $t_0$ at which the recording mode is set, the transistor T2 in the current control circuit 16 is turned off, and the Zener diode D1 breaks down. For this reason, the current control circuit 16 starts the current control operation. With this control, since the switch elements S1 and S2 are ON, a current is supplied from the current control circuit 16 to the auxiliary coils L1 and L2, as shown in FIGS. 5G and 5H.

In this manner, when a current is supplied to the auxiliary coils L1 and L2 at the beginning of the recording mode, and the currents of the auxiliary coils L1 and L2 rise after an elapse of a predetermined period of time, the control signal C1 is inverted to low level at time $t_1$, as shown in FIG. 5B, and information recording is started. When information is recorded, the gate drive circuit 10 generates the drive signal g1 which is in-phase with the information signal d and the drive signal g2 which has a phase opposite to that of the drive signal g1, and applies these signals to the gates of the switch elements S1 and S2. With these signals, since the switch elements S1 and S2 are alternately turned on, the current direction of the main coil Lh is switched in correspondence with the information signal, and an alternating current is supplied, as shown in FIG. 5I. The main coil Lh is driven in this manner, and the magnetic head generates a bias magnetic field modulated in correspondence with the information signal. As shown in FIG. 1, the magnetic head is arranged near the surface of a magnetooptical disk 1, and the modulated magnetic field from the magnetic head is applied onto a recording layer 1a as a recording magnetic field. On the other hand, a constant high-power laser beam is irradiated from an optical head 4 onto the magnetooptical disk 1, and a series of information marks are recorded on the recording layer 1a by irradiation with the laser beam and application of the modulated magnetic field.

During information recording, since the switch elements S1 and S2 are turned on/off, voltage pulses P1 are generated by counter electromotive forces of the auxiliary coils L1 and L2 when the elements S1 and S2 are turned off. FIGS. 5J and 5K show the waveforms of potentials $V_{Q1}$ and $V_{Q2}$ at nodes Q1 and Q2 in FIG. 4, i.e., show the above-mentioned voltage pulses P1. The crest value of the voltage pulse P1 is as low as several tens of volts, as described above, and does not destroy the switch elements S1 and S2. During information recording, the current control circuit 16 controls a current to be supplied to the magnetic head drive circuit to be constant by the above-mentioned current control operation. Therefore, even when a voltage from the DC power supply V drifts, a constant current is always supplied to the auxiliary coils L1 and L2, as shown in FIGS. 5G and 5H, and the drive current of the main coil Lh is controlled to be constant.

When information recording is finished at time $t_4$, the control signal C1 is inverted to high level, as shown in FIG. 5B, and the information signal d goes to low level simultaneously at the end of recording. Thus, the drive signals g1 and g2 from the gate drive circuit 10 go to high level, as shown in FIGS. 5E and 5F, and the switch elements S1 and S2 are respectively turned on. As shown in FIG. 5D, the control signal C3 is inverted to high level simultaneously as the control signal C1, and the transistor T2 in the current control circuit 16 is turned on. With this operation, the Zener diode D1 is forcibly short-circuited, and the reference voltage V1 becomes nearly 0 V. For this reason, the transistor T1 shifts from an active state to an inactive state, and a current to be supplied from the current control circuit 16 to the magnetic head drive circuit gradually decreases. Therefore, currents $I_{L1}$ and $I_{L2}$ of the auxiliary coils L1 and L2 gradually decrease from recording end time $t_4$, as shown in FIGS. 5G and 5H. In addition, as shown in FIG. 5M, the laser beam power is controlled to be switched from high power to low power at recording end time $t_4$.

When the currents of the auxiliary coils L1 and L2 gradually decrease at the end of recording, the current decrease characteristics are determined by the response characteristics of the current control circuit 16. Therefore, in order to properly slow down the decrease speed of the currents $I_{L1}$ and $I_{L2}$, a differential amplifier having frequency characteristics corresponding to a required current decrease speed can be selected as the differential amplifier 17 or 18. Alternatively, a low-pass filter 19 may be inserted in the control system of the current control circuit 16 so as to gradually decrease the current of the transistor T1. Furthermore, a low-pass filter may be arranged at the input side of the transistor T2 so as to gradually turn on the transistor T1. This arrangement will be described in detail later as the second embodiment. When the currents of the auxiliary coils L1 and L2 gradually decrease, the decrease speed need only be sufficiently lower than the change speed upon switching of the current direction of the main coil Lh. For example, the currents of the auxiliary coils L1 and L2 can decrease over the width of, e.g., the shortest pulse included in the information signal d or more.

Figure 11:
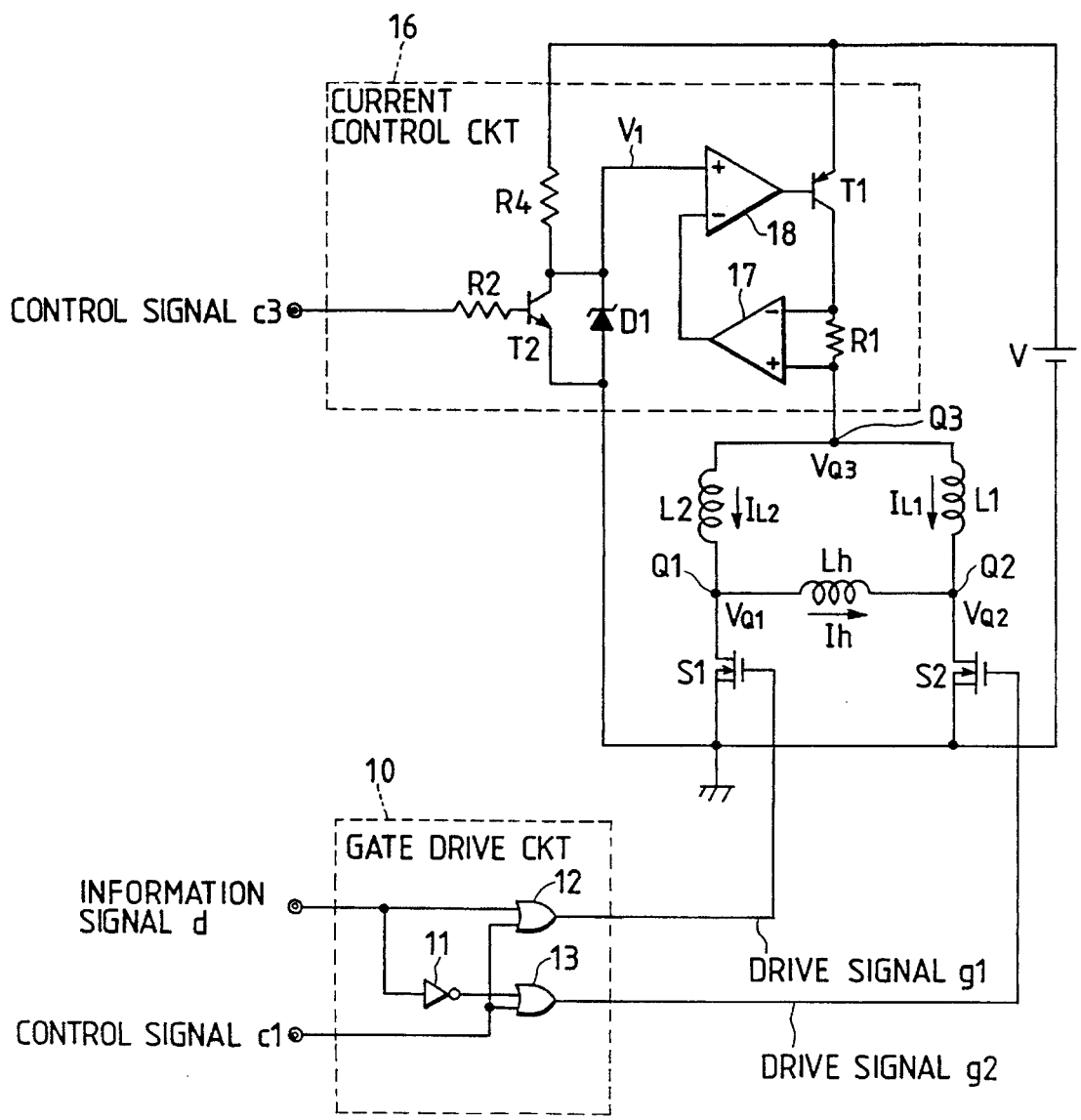
FIG. 11 is a circuit diagram showing the sixth embodiment of the present invention.

At time $t_5$ a predetermined period of time after the end of information recording, as shown in FIG. 5C, the control signal C2 is inverted to low level, thus ending the recording mode. In this manner, the operation mode shifts to the reproducing mode. In the reproducing mode, since the control signal C2 is inverted to low level, the drive signals g1 and g2 from the gate drive circuit 10 go to low level, as shown in FIGS. 5E and 5F, and the switch elements S1 and S2 are maintained in an OFF state. Therefore, in the reproducing mode, the drive operation of the magnetic head stops. On the other hand, in the reproducing mode, as shown in FIG. 11, a low-power laser beam is irradiated from the optical head 4 onto the magnetooptical disk 1, and light reflected by the disk 1 is detected by a photodetector in the optical head 4. Information is reproduced based on the detection signal from the photodetector by utilizing the Kerr effect.

In this embodiment, upon completion of recording, the switch elements S1 and S2 are maintained in an ON state, and a current supplied from the current control circuit 16 gradually decreases. For this reason, since the currents of the auxiliary coils L1 and L2 slowly decrease at the end of recording, high voltage pulses, which were observed in the conventional device, will not be generated at the nodes Q1 and Q2, as shown in FIGS. 5J and 5K, and generation of a high voltage upon an abrupt change in current of the auxiliary coils L1 and L2 can be effectively prevented. Therefore, since generation of an overvoltage as high as several hundreds of volts can be prevented, the switch elements can be protected from the overvoltage without being destroyed. Therefore, a switch element which does not have a high withstanding voltage can be used, and an ON resistance of the element is sufficiently small, thus suppressing an increase in power consumption of the magnetic head drive circuit.

Since the currents of the auxiliary coils L1 and L2 gradually decrease, generation of the counter electromotive forces of the auxiliary coils L1 and L2 can be suppressed, and a potential $V_{Q3}$ at a node Q3 can be sufficiently lowered, as shown in FIG. 5L. Therefore, the current control circuit 16 can be prevented from being destroyed by an overvoltage. Furthermore, in this embodiment, since a current is supplied to the auxiliary coils L1 and L2 prior to information recording, as shown in FIGS. 5G and 5H, a recording error caused by an insufficient current of the main coil Lh immediately after the beginning of recording can be prevented. More specifically, when the magnetic head is driven, since the inductances of the auxiliary coils are large in the conventional device, a long time is required until the drive current of the main coil rises to a prescribed value, and when the magnetic head is driven before the current of the main coil rises, a recording error often occurs due to an insufficient magnetic field strength of the magnetic head. In order to prevent this, as described above, a current is supplied to the auxiliary coils prior to information recording, thus preventing a recording error. The present inventor has already filed this case as Japanese Patent Application No. 5-40727 (U.S. patent application Ser. No. 08/018,424).

As described above, the magnetic head drive device according to the first embodiment of the present invention has a pair of auxiliary coils, a pair of switch elements respectively connected in series with the pair of auxiliary coils, and switch element drive means, and switches the direction of a drive current of a magnetic head arranged between nodes of the pair of auxiliary coils and the pair of switch elements in correspondence with an information signal by alternately turning on the pair of switch elements in correspondence with the information signal. In this device, the switch element drive means controls operation to maintain at least one of the pair of switch elements in an ON state for a predetermined period of time upon completion or interruption of information recording, and the device comprises current control means for gradually decreasing a current to be supplied to the pair of auxiliary coils while the switch element is in the ON state.

The current control means comprises a current control element (transistor T1) for controlling a current to be supplied from the DC power supply to the pair of auxiliary coils. The current control means controls a current to be supplied to the pair of auxiliary coils to a predetermined value in the information recording mode, and controls operation to gradually decrease the current to be supplied to the pair of coils upon completion or interruption of information recording.

The magnetic head drive device according to the first embodiment is used in a magnetic recording apparatus described above with reference to FIG. 1.

The magnetic recording apparatus according to the present invention has a magnetic head arranged near a surface of a recording medium, and a magnetic head drive circuit which is constituted by a pair of auxiliary coils for driving the magnetic head, a pair of switch elements respectively connected in series with the pair of auxiliary coils, and switch element drive means, and modulates a magnetic field generated by the magnetic head in correspondence with an information signal to be recorded by switching a current direction of the magnetic head by alternately turning on the pair of switch elements in correspondence with the information signal, and records information by applying the modulated magnetic field of the magnetic head to the recording medium. In this apparatus, the switch element drive means controls operation to maintain at least one of the pair of switch elements in an ON state for a predetermined period of time upon completion or interruption of information recording, and the apparatus comprises current control means for gradually decreasing a current to be supplied to the pair of auxiliary coils while the switch element is in the ON state.

Figure 6:
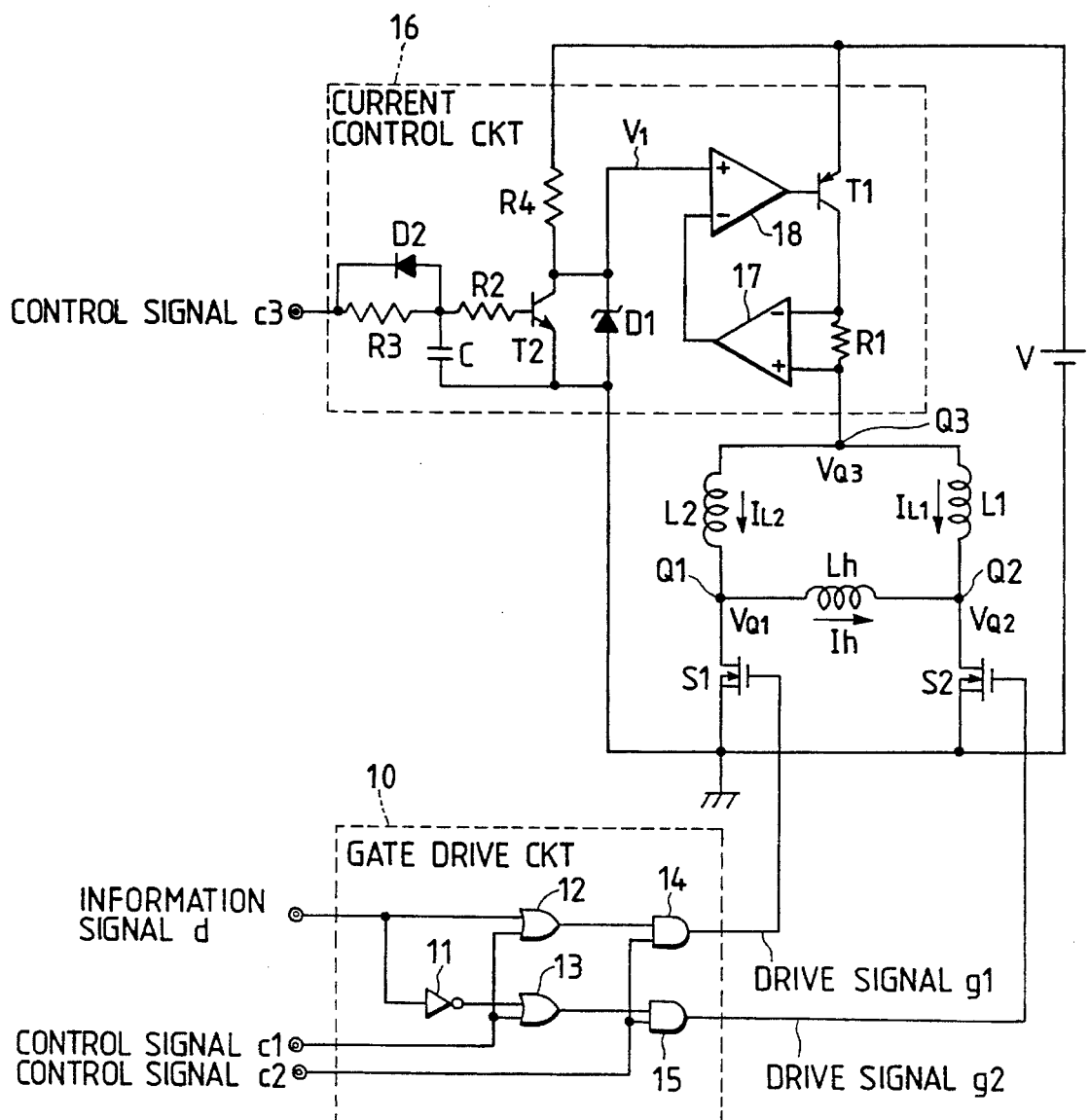
FIG. 6 is a circuit diagram showing the second embodiment of the present Invention.

FIG. 6 is a circuit diagram showing the second embodiment of the present invention. In this embodiment, as described above, a low-pass filter is arranged at the input side of the transistor T2 to control a current of the transistor T1 to gradually decrease it. Referring to FIG. 6, a time constant circuit comprising a resistor R3 and a capacitor C is arranged at the input side of the transistor T2 in the current control circuit 16. The time constant circuit operates to gradually increase the base potential of the transistor T2 by its time constant so as to gradually turn on the transistor T2 when the control signal C3 goes to high level upon completion of information recording. With this control, the reference voltage V1 gradually approaches 0 V, and the transistor T1 is gradually disabled upon a decrease in voltage. As a result, a current to be supplied to the auxiliary coil can be slowly decreased.

A diode D2 is connected in parallel with the resistor R3. This diode D2 is used for decreasing the base potential of the transistor T2 to quickly turn off the transistor T2 when the control signal C3 goes to low level at time $t_0$ at the beginning of the recording mode. More specifically, when the diode D2 is not connected, the base potential of the transistor T2 gradually decreases by the time constant defined by the resistor R3 and the capacitor C, and the OFF timing of the transistor T2 is delayed. For this reason, by connecting the diode D2, the transistor T2 can be turned off at high speed, and the supply timing of a current from the current control circuit 16 to the auxiliary coils can be prevented from being delayed at the beginning of the recording mode.

Figure 7:
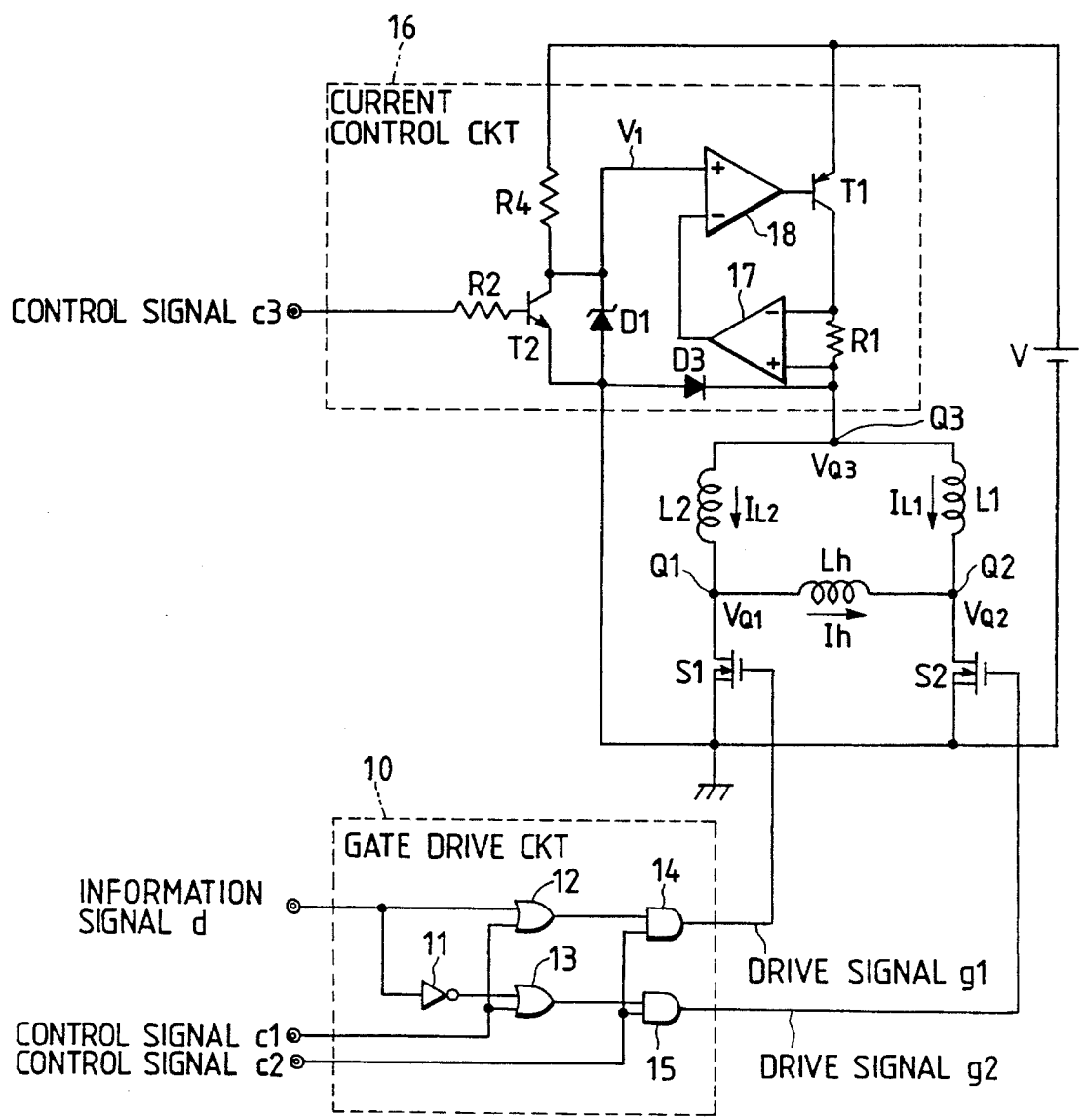
FIG. 7 is a circuit diagram showing the third embodiment of the present invention.

FIG. 7 is a circuit diagram showing the third embodiment of the present invention. In this embodiment, upon completion of information recording, a current is supplied from a path other than the transistor T1 to the auxiliary coils to gradually decrease the currents of the auxiliary coils. Referring to FIG. 7, a diode D3 is connected between ground and the node between the auxiliary coils L1 and L2. The diode D3 operates to supply currents generated by the counter electromotive forces of the auxiliary coils L1 and L2 from the ground to the auxiliary coils L1 and L2. When the control signal C3 goes to high level at time $t_4$ at the end of information recording, a current to be supplied to the auxiliary coils L1 and L2 decreases, as described above. At this time, if the currents of the auxiliary coils L1 and L2 abruptly decrease, currents generated by the counter electromotive forces of the auxiliary coils L1 and L2 are supplied from the ground to the auxiliary coils L1 and L2 via the diode D3. Therefore, even when the currents of the auxiliary coils L1 and L2 abruptly decrease, the abrupt decrease in current can be compensated for via the diode D3, and, consequently, the currents of the auxiliary coils L1 and L2 slowly decrease, thus preventing generation of high voltage pulses.

In the third embodiment of the present invention, since the potential at the node Q3 is clamped by the diode D3, the potential at the node Q3 can be prevented from being largely lowered from the ground level, and destruction of the current control circuit 16 due to an overvoltage can be prevented. Note that the decrease speed of the currents of the auxiliary coils may be adjusted by connecting a resistor in series with the diode D3. Also, another current supply path for compensating for a decrease in current of the auxiliary coils may be constituted by a switch element. In each of the first to third embodiments described above, the currents of the auxiliary coils are slowly decreased by maintaining the switch elements S1 and S2 in an ON state during a predetermined period until the operation mode shifts to the reproducing mode after the end of recording. In this case, at least one of the switch elements need only be maintained in an ON state.

In the third embodiment of the present invention, the current control means (current control circuit 16) further comprises a current supply path for compensating for a decrease in current to be supplied from the DC power supply to the pair of auxiliary coils via a current control element (diode D3), thereby gradually decreasing the currents of the auxiliary coils upon completion or interruption of information recording.

Figure 8:
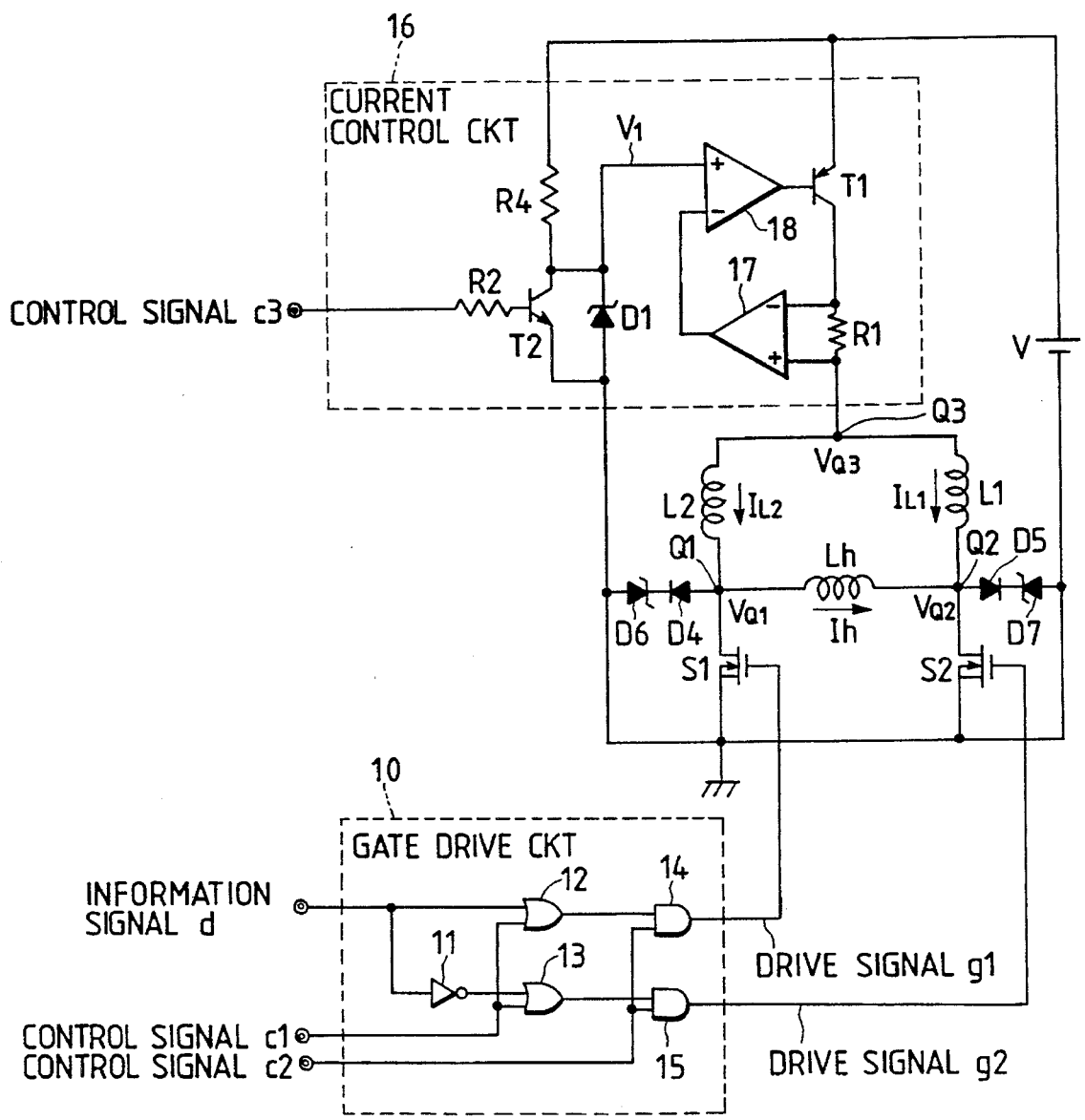
FIG. 8 is a circuit diagram showing the fourth embodiment of the present invention.

FIG. 8 is a circuit diagram showing the fourth embodiment of the present invention. In this embodiment, contrary to the above-mentioned embodiments, the switch elements S1 and S2 are turned off upon completion of recording, and overvoltages generated by the auxiliary coils upon completion of recording are clamped by clamp circuits, thereby protecting the switch elements. Referring to FIG. 8, a clamp circuit as a series circuit of a diode D5 and a Zener diode D7 is arranged between ground and the node Q2 between the auxiliary coil L1 and the switch element S2. Also, a clamp circuit as a series circuit of a diode D4 and a Zener diode D6 is arranged between ground and the node Q1 between the auxiliary coil L2 and the switch element S1.

Figure 9:
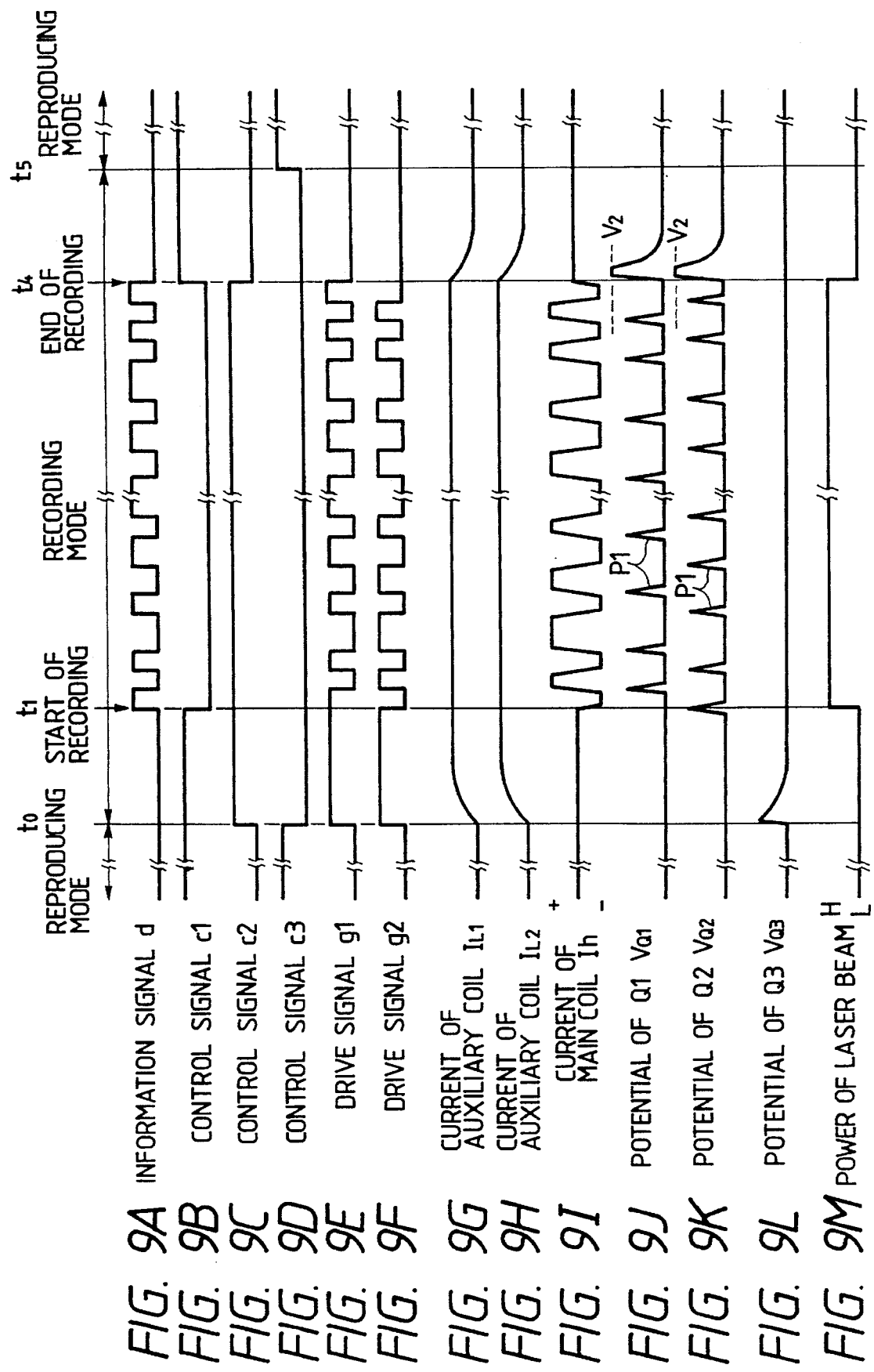
FIGS. 9A to 9M are timing charts showing the operations of the embodiment shown in FIG. 8.

The operation of this embodiment will be described below with reference to FIGS. 9A to 9M. Since the operations until the operation mode shifts from the reproducing mode to the recording mode at time $t_0$, and information recording is started at time $t_1$ are the same as those in the first to third embodiments, a detailed description thereof will be omitted. Upon completion of information recording at time $t_4$, the control signal C1 is inverted to high level, as shown in FIG. 9B, and the control signal C2 is simultaneously inverted to low level, as shown in FIG. 9C. As shown in FIG. 9M, the laser beam power is switched from high power to low power. The control signal C3 is kept at low level until time $t_5$ corresponding to the end timing of the recording mode. When the control signal C1 goes to high level and the control signal C2 goes to low level, the drive signals g1 and g2 from the gate drive circuit 10 go to low level, as shown in FIGS. 9E and 9F, and the switch elements S1 and S2 are turned off. Thus, the currents of the auxiliary coils L1 and L2 are cut off at high speed, and high voltages are generated by their counter electromotive forces. At this time, since the potentials at the nodes Q1 and Q2 exceed the Zener breakdown voltages of the Zener diodes D6 and D7, the currents of the auxiliary coils L1 and L2 respectively flow into a path of the diode D5 and the Zener diode D7 and a path of the diode D4 and the Zener diode D6, and slowly decrease, as shown in FIGS. 9G and 9H.

If the Zener breakdown voltage $v_Z$ of the Zener diodes D6 and D7 is set to have a value slightly larger than the crest value of voltage pulses P1 generated upon completion of information recording shown in FIGS. 9J and 9K, since the potentials at the nodes Q1 and Q2 are lower than the Zener breakdown voltage $v_Z$ during information recording, no current is supplied to the Zener diodes D6 and D7. Therefore, as shown in FIGS. 9J and 9K, only at the end of recording, high voltages generated by the auxiliary coils L1 and L2 can be clamped by the clamp voltages $v_Z$ of the diode D5 and the Zener diode D7, and the diode D4 and the Zener diode D6, and destruction of the switch elements S1 and S2 can be prevented. Note that the clamp voltage $v_Z$ is higher than the voltage of the DC power supply V.

On the other hand, at recording end time $t_4$, since the control signal C3 is kept at low level, as shown in FIG. 9D, the current control circuit 16 keeps operating to supply a current to the magnetic head drive circuit. At this time, since the switch elements S1 and S2 are OFF, the current control circuit 16 falls outside a control range as a constant current circuit, and the transistor T1 is turned on. Thus, the potential at the node Q3 is clamped by the power supply voltage from the DC power supply V, and even when high voltages are generated by the auxiliary coils L1 and L2 upon completion of recording, the potential at the node Q3 can be prevented from being excessively lowered below the power supply voltage, as shown in FIG. 9L, thus preventing destruction of the current control circuit 16 by an overvoltage. More specifically, when the operation of the current control circuit 16 is stopped at the end of recording, the potential at the node Q3 becomes a negative overvoltage due to the counter electromotive forces of the auxiliary coils. For this reason, a decrease in potential at the node Q3 is prevented by continuing the operation of the current control circuit 16, thereby protecting the current control circuit 16. In this embodiment, the diodes D4 and D5 are arranged to prevent reverse flow of currents to the Zener diodes D6 and D7.

Also, a clamp circuit is not limited to one using a Zener diode, but various other clamp circuits using, e.g., resistors, may be used.

As described above, the magnetic head drive device according to the fourth embodiment of the present invention comprises the gate drive circuit for maintaining at least one of the pair of switch elements S1 and S2 in an ON state upon completion or interruption of information recording, and the current control circuit 16 for gradually decreasing a current to be supplied to the pair of auxiliary coils L1 and L2 while the switch element is maintained in the ON state. Upon completion or interruption of information recording, the switch elements S1 and S2 are turned off, and overvoltages applied to the switch elements S1 and S2 due to the OFF operation of the switch elements are clamped by the clamp circuits (the diodes D4 and D6, and the diodes D5 and D7). In addition, the current control circuit 16 is kept in an ON state, thereby clamping a voltage applied to the current control circuit 16 by the power supply voltage.

The magnetic head drive device according to the fourth embodiment of the present invention has a pair of auxiliary coils and a pair of switch elements respectively connected in series with the pair of auxiliary coils, and switches the direction of a drive current of a magnetic head arranged between nodes of the pair of auxiliary coils and the pair of switch elements in correspondence with an information signal by alternately turning on the pair of switch elements in correspondence with the information signal. The device comprises switch element drive means for driving the pair of switch elements, and clamp means for clamping voltages to be applied to the pair of switch elements by counter electromotive forces from the pair of auxiliary coils. In this device, the pair of switch elements are turned off by the switch element drive means upon completion or interruption of information recording, and voltages, based on the counter electromotive forces of the auxiliary coils, to be applied to the switch elements due to the OFF operation of the pair of switch elements are clamped by the clamp means.

The magnetic head drive device of the fourth embodiment described above is used in a magnetic recording apparatus described above with reference to FIG. 1.

The magnetic recording apparatus according to the present invention has a magnetic head arranged near a surface of a recording medium, and a magnetic head drive circuit which is constituted by a pair of auxiliary coils for driving the magnetic head and a pair of switch elements respectively connected in series with the pair of auxiliary coils, and modulates a magnetic field generated by the magnetic head in correspondence with an information signal to be recorded by switching a current direction of the magnetic head by alternately turning on the pair of switch elements in correspondence with the information signal, and records information by applying the modulated magnetic field of the magnetic head to the recording medium. The apparatus comprises switch element drive means for driving the pair of switch elements, and clamp means for clamping voltages to be applied to the pair of switch elements due to counter electromotive forces from the pair of auxiliary coils. In this apparatus, the pair of switch elements are turned off by the switch element drive means upon completion or interruption of information recording, and voltages, based on the counter electromotive forces of the auxiliary coils, to be applied to the switch elements due to the OFF operation of the pair of switch elements are clamped by the clamp means.

The fifth embodiment of the present invention will be described below. When information is recorded on a recording medium which is formatted to have preformat and data regions in units of sectors, a recording operation is temporarily stopped on the preformat region, as described above. When information is continuously recorded on a plurality of sectors of such a recording medium using the magnetic head drive device according to each of the first to fourth embodiments, every time information recording is interrupted on the preformat region of each sector, the currents of the auxiliary coils can be gradually decreased, as described above. Therefore, every time recording of information for each sector is interrupted, high voltage pulses can be prevented from being generated. For this reason, even a switch element with a low withstanding voltage can be used. It is also effective to keep supplying currents to the auxiliary coils on the preformat region without cutting off the currents, in view of preventing generation of high voltage pulses by the auxiliary coils. Such an arrangement will be described below as the fifth embodiment. Note that this embodiment may adopt any of the magnetic head drive devices of the first to fourth embodiments.

Figure 10:
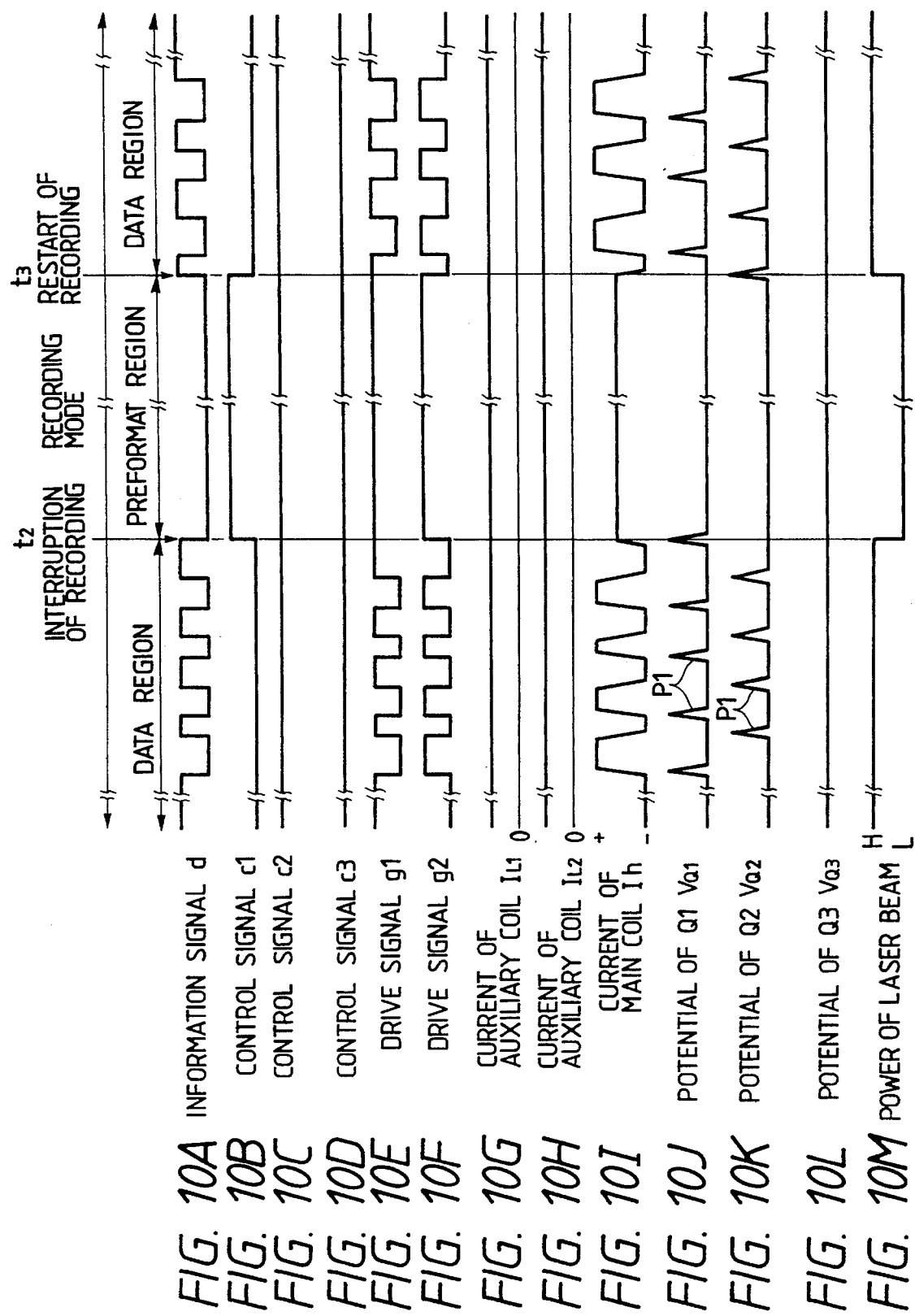
FIGS. 10A to 10M are timing charts showing the operations according to the fifth embodiment of the present invention.

FIGS. 10A to 10M are timing charts showing the operations of this embodiment, and show signals of the respective sections in correspondence with the data region and the preformat region of each sector of the recording medium. First, in the data region, the control signal C1 is at low level, as shown in FIG. 10B, the control signal C2 is at high level, as shown in FIG. 10C, and the control signal C3 is at low level, as shown in FIG. 10D. At this time, the gate drive circuit 10 generates the drive signals g1 and g2, as shown in FIGS. 10E and 10F, in correspondence with the information signal (FIG. 10A), and drives the switch elements S1 and S2. With this operation, the main coil Lh receives a drive current in correspondence with the information signal, as shown in FIG. 10I, and information is recorded on the data region of the recording medium by a magnetic field generated by the magnetic head and a high-power laser beam irradiated from the optical head, as shown in FIG. 10M.

When the data region is interrupted at time $t_2$ and the preformat region starts, the control signal C1 is inverted to high level, as shown in FIG. 10B, and the drive signals g1 and g2 from the gate drive circuit 10 go to high level, as shown in FIGS. 10E and 10F, thus maintaining the switch elements S1 and S2 in an ON state. In this case, the control signal C2 is kept at high level, and the control signal C3 is kept at low level. Therefore, during the preformat region period, a current is kept supplied to the auxiliary coils L1 and L2 without being cut off, as shown in FIGS. 10G and 10H. On the other hand, the laser beam power is switched to low power, as shown in FIG. 10M. When the data region starts again at time $t_3$, the control signal C1 is inverted to low level again, and at the same time, the laser beam power is switched to high power, thus recording information on the data region.

In this embodiment, since the switch elements are maintained in an ON state during the preformat region period to keep supplying a current to the auxiliary coils, when recording is interrupted upon transition from the data region to the preformat region, generation of high voltages by the auxiliary coils can be completely prevented. Since the currents of the auxiliary coils do not change, overvoltages can be prevented from being generated at the node Q3, as shown in FIG. 10L, and destruction of the current control circuit 16 can be completely prevented. Furthermore, in the conventional device, since the currents of the auxiliary coils do not sufficiently rise at the beginning of recording, a recording error may often be caused by an insufficient magnetic field. However, in this embodiment, since a current is continuously supplied to the auxiliary coils even during the preformat region period, the current to the main coil can be prevented from becoming insufficient at the beginning of recording, and a recording error caused by an insufficient magnetic field can be prevented. In this embodiment, both the switch elements S1 and S2 are maintained in an ON state during the preformat region period. In this case, at least one of the switch elements need only be maintained in an ON state.

As described above, in the magnetic head drive device according to the fifth embodiment of the present invention, when a recording medium is one which is formatted to have data and preformat regions in units of sectors, switch element drive means turns on at least one of the switch elements during a preformat region period to keep supplying a current to the auxiliary coils.

FIG. 11 is a circuit diagram showing the sixth embodiment of the present invention. In the first to third embodiments, the currents of the auxiliary coils are slowly decreased upon completion of recording. In the fifth embodiment, when information is recorded on a recording medium which is formatted to have data and preformat regions in units of sectors, a current is continuously supplied to the auxiliary coils during a preformat region period. In this embodiment, these two features are combined. More specifically, upon completion of recording, the currents of the auxiliary coils are slowly decreased, and in an operation other than the recording operation (including the reproducing mode and the preformat region period in the recording mode), at least one of the switch elements S1 and S2 is kept in an ON state to keep supplying a current to the auxiliary coils.

Referring to FIG. 11, the gate drive circuit 10 comprises the inverting gate 11 and the two OR gates 12 and 13, and outputs the drive signals g1 and g2 in correspondence with the information signal d during only a high-level period of the control signal C1. During the high-level period of the control signal C1, the drive signals g1 and g2 go to high level, and the switch elements S1 and S2 are maintained in an ON state. The current control circuit 16 has the same arrangement as that in the embodiment shown in FIG. 4. When the control signal C3 goes to high level at the end of recording, a current supplied from the current control circuit 16 gradually decreases to slowly decrease the currents of the auxiliary coils L1 and L2. Other arrangements are the same as those in the embodiment shown in FIG. 4. Note that the control signal C2 is not used in this embodiment.

The operation of this embodiment will be described below. The operations in the reproducing mode and the recording mode will be described below with reference to FIGS. 12A to 12L. In the reproducing mode, as shown in FIGS. 12B and 12C, the control signals C1 and C3 are at high level. When the recording mode starts at time $t_0$, the control signal C3 goes to low level to enable the current control circuit 16, and a current is supplied to the auxiliary coils L1 and L2, as shown in FIGS. 12F and 12G. When the currents of the auxiliary coils L1 and L2 sufficiently rise after an elapse of a predetermined period of time, the control signal C1 is inverted to low level at time $t_1$, as shown in FIG. 12B, and the gate drive circuit 10 outputs the drive signals g1 and g2, as shown in FIGS. 12D and 12E. At the same time, the laser beam power is switched from low power to high power, as shown in FIG. 12L. With this operation, the switch elements S1 and S2 are driven, and a drive current is supplied to the main coil Lh, as shown in FIG. 12H. As a result, a modulated magnetic field is applied from the magnetic head to the recording medium, and information is recorded.

Upon completion of information recording at time $t_4$, the laser beam power is switched from high power to low power, as shown in FIG. 12L, and at the same time, the control signals C1 and C3 are inverted to high level, as shown in FIGS. 12B and 12C. As a result, the drive signals g1 and g2 from the gate drive circuit 10 go to high level, as shown in FIGS. 12D and 12E, and the switch elements S1 and S2 are maintained in an ON state. Since the control signal C3 goes to high level, a current supplied from the current control circuit 16 gradually decreases, as described above, and the currents of the auxiliary coils L1 and L2 slowly decrease, as shown in FIGS. 12F and 12G. Therefore, high voltages can be prevented from being generated due to the counter electromotive forces of the auxiliary coils L1 and L2 upon completion of recording, and the potentials at the nodes Q1 and Q2 are normal without becoming high voltages, as shown in FIGS. 12I and 12J. Since the currents of the auxiliary coils are slowly decreased, a decrease in potential at the node Q3 can also be suppressed, as shown in FIG. 12K.

The operation executed when information is recorded on the recording medium which is formatted to have data and preformat regions in units of sectors will be described below with reference to FIGS. 13A to 13L. Since the operation in the data region is the same as that in the recording mode shown in FIGS. 12A to 12L, a detailed description thereof will be omitted. During a data region period, the laser beam has high power, as shown in FIG. 13L, and both the control signals C1 and C3 are at low level, as shown in FIGS. 13B and 13C. With this operation, the gate drive circuit 10 and the current control circuit 16 operate to supply a drive current to the main coil Lh, and information is recorded on the data region. When the data region ends at time $t_2$ and the preformat region starts, the laser beam power is switched to low power, as shown in FIG. 13L, and the control signal C1 goes to high level, as shown in FIG. 13B. At the same time, the drive signals g1 and g2 from the gate drive circuit 10 go to high level, as shown in FIGS. 13D and 13E, and the switch elements S1 and S2 are maintained in an ON state. As a result, the current control circuit 16 supplies a constant current to the auxiliary coils L1 and L2 continuously from the data region, as shown in FIGS. 13F and 13G, and although the recording operation is interrupted during a preformat region period, the current is continuously supplied to the auxiliary coils. Therefore, upon completion of the data region, generation of high voltages due to a change in current of the auxiliary coils at the nodes Q1 and Q2 can be prevented, as shown in FIGS. 13I and 13J, and the currents of the auxiliary coils do not change at all at the node Q3, as shown in FIG. 13K. Therefore, no overvoltages are generated at all.

In this embodiment, the currents of the auxiliary coils are slowly decreased upon completion of recording, and when a recording operation is interrupted on a preformat region in a recording medium having data and preformat regions in units of sectors, a current is continuously supplied to the auxiliary coils. For this reason, generation of high voltages due to the counter electromotive forces of the auxiliary coils can be prevented upon completion or interruption of recording. Therefore, since no overvoltage is applied to the switch elements and the current control circuit, the switch elements and the current control circuit can be protected from being destroyed by the overvoltages. Since a current is continuously supplied to the auxiliary coils, the current to the main coil can sufficiently rise and a recording error due to an insufficient magnetic field from the magnetic head can be prevented. In this embodiment, when the current is continuously supplied to the auxiliary coils, both the switch elements S1 and S2 are maintained in an ON state. In this case, at least one of the switch elements need only be maintained in the ON state.

The above-mentioned magnetic head drive device according to the sixth embodiment of the present invention has a pair of auxiliary coils and a pair of switch elements respectively connected in series with the pair of auxiliary coils, and switches the direction of a drive current of a magnetic head arranged between nodes of the pair of auxiliary coils and the pair of switch elements in correspondence with an information signal by alternately turning on the pair of switch elements in correspondence with the information signal. The device comprises switch element drive means for controlling operation to maintain at least one of the pair of switch elements in an ON state in a state other than an information recording state, and current control means for gradually decreasing a current to be supplied to the pair of auxiliary coils upon completion or interruption of information recording.

The magnetic recording apparatus which uses the magnetic head drive device according to the sixth embodiment of the present invention has a magnetic head arranged near a surface of a recording medium, and a magnetic head drive circuit which is constituted by a pair of auxiliary coils for driving the magnetic head and a pair of switch elements respectively connected in series with the pair of auxiliary coils, and modulates a magnetic field generated by the magnetic head in correspondence with an information signal to be recorded by switching a current direction of the magnetic head by alternately turning on the pair of switch elements in correspondence with the information signal, and records information by applying the modulated magnetic field of the magnetic head to the recording medium. The apparatus comprises switch element drive means for controlling operation to maintain at least one of the pair of switch elements in an ON state in a state other than an information recording state, and current control means for gradually decreasing a current to be supplied to the pair of auxiliary coils upon completion or interruption of information recording.

The magnetic recording apparatus of each of the first to sixth embodiments further comprises an optical head for irradiating a light beam onto a recording medium, and records information on the recording medium by irradiation of the light beam from the optical head and application of a modulated magnetic field from the magnetic head.

In each of the above embodiments, a magnetooptical recording apparatus adopting a magnetic field modulation method for recording information by irradiation of a light beam and application of a modulated magnetic field has been exemplified as an information recording apparatus. However, the present invention is not limited to this but may be applied to a magnetic recording apparatus for recording information by applying a modulated magnetic field.

As described above, the present invention can provide the following effects.

(1) Upon completion or interruption of information recording, the switch elements are turned on to gradually decrease the currents of the auxiliary coils. For this reason, overvoltages generated by the counter electromotive forces of the auxiliary coils can be suppressed, and the switch elements can be prevented from being destroyed by application of the overvoltages. Therefore, since a switch element with a large withstanding voltage need not be used, an increase in power consumption of the device can be prevented, and destruction of the switch elements can be prevented while the power consumption remains the same.

(2) Upon completion or interruption of information recording, the switch elements are turned off, and the counter electromotive voltages of the auxiliary coils applied to the switch elements upon the OFF operation are clamped by the clamp means, thus protecting the switch elements from overvoltages. Since the current control means for supplying a predetermined current to the auxiliary coils is kept operated, and the current control means is set in an ON state upon the OFF operation of the switch elements, a voltage applied to the current control means can be clamped by the power supply voltage. Therefore, the current control means can also be protected from overvoltages generated by the counter electromotive forces of the auxiliary coils.

(3) When information is recorded on a recording medium which has data and preformat regions in units of sectors, a current is continuously supplied to the auxiliary coils during a preformat region period. Therefore, overvoltages can be prevented from being repetitively generated in units of sectors upon continuous recording of information on a plurality of sectors unlike in conventional devices, and destruction of the switch elements can be effectively prevented.

(4) In a state other than an information recording mode, the switch elements are set in an ON state, and upon completion or interruption of information recording, the currents of the auxiliary coils are gradually decreased by the current control means. Therefore, overvoltages can be prevented from being repetitively generated in units of sectors in a recording medium which has data and preformat regions in units of sectors, and overvoltages can also be prevented from being generated upon completion or interruption of recording, thus preventing destruction of the switch elements.

What is claimed is:

1. A magnetic head drive device comprising:

a pair of auxiliary coils;

a pair of switch elements respectively connected in series with said pair of auxiliary coils;

a magnetic head arranged between nodes of said pair of auxiliary coils and said pair of switch elements;

switch element drive means for driving said pair of switch elements, said switch element drive means controlling operation to maintain at least one of said pair of switch elements in an ON state for a predetermined period of time upon completion or interruption of information recording by said magnetic head; and current control means for gradually decreasing a current to be supplied to said pair of auxiliary coils during the ON state.

2. A device according to claim 1, wherein said current control means controls the current to be supplied to said pair of auxiliary coils to a predetermined value during information recording by said magnetic head, and controls operation to gradually decrease the current to be supplied to said pair of auxiliary coils upon completion or interruption of information recording by said magnetic head.

3. A device according to claim 1, wherein said current control means comprises a current control element for controlling a current supplied from a DC power supply to said pair of auxiliary coils.

4. A device according to claim 1, wherein said current control element comprises a transistor.

5. A magnetic recording apparatus comprising:

a magnetic head arranged near a surface of a recording medium;

a pair of auxiliary coils;

a pair of switch elements respectively connected in series with said pair of auxiliary coils;

switch element drive means for driving said pair of switch elements, said switch element drive means controlling operation to maintain at least one of said pair of switch elements in an ON state for a predetermined period of time upon completion or interruption of information recording by said magnetic head; and current control means for gradually decreasing a current to be supplied to said pair of auxiliary coils during the ON state.

6. An apparatus according to claim 5, wherein said magnetic recording apparatus is used in a magnetooptical recording apparatus.

7. A magnetic head drive device comprising:

a pair of auxiliary coils;

a pair of switch elements respectively connected in series with said pair of auxiliary coils;

a magnetic head arranged between nodes of said pair of auxiliary coils and said pair of switch elements;

switch element drive means for driving said pair of switch elements, said switch element drive means setting said pair of switch elements in an OFF state upon completion or interruption of information recording by said magnetic head; and clamp means for clamping voltages to be applied to said pair of switch elements due to counter electromotive forces from said pair of auxiliary coils during the OFF state.

8. A magnetic recording apparatus comprising:

a magnetic head arranged near a surface of a recording medium;

a pair of auxiliary coils;

a pair of switch elements respectively connected in series with said pair of auxiliary coils;

switch element drive means for driving said pair of switch elements, said switch element drive means setting said pair of switch elements in an OFF state upon completion or interruption of information recording by said magnetic head; and clamp means for clamping voltages to be applied to said pair of switch elements due to counter electromotive forces from said pair of auxiliary coils during the OFF state.

9. An apparatus according to claim 8, wherein said magnetic recording apparatus is used in a magnetooptical recording apparatus.

10. A magnetic head drive device comprising:

a pair of auxiliary coils;

a pair of switch elements respectively connected in series with said pair of auxiliary coils;

a magnetic head arranged between nodes of said pair of auxiliary coils and said pair of switch elements;

switch element drive means for driving said pair of switch elements, said switch element drive means controlling operation to maintain at least one of said pair of switch elements in a non-information recording ON state of said magnetic head; and current control means for gradually decreasing a current to be supplied to said pair of auxiliary coils upon completion or interruption of information recording by said magnetic head.

11. A magnetic recording apparatus comprising:

a magnetic head arranged near a surface of a recording medium;

a pair of auxiliary coils;

a pair of switch elements respectively connected in series with said pair of auxiliary coils;

switch element drive means for driving said pair of switch elements, said switch element drive means controlling operation to maintain at least one of said pair of switch elements in a non-information recording ON state of said magnetic head; and current control means for gradually decreasing a current to be supplied to said pair of auxiliary coils upon completion or interruption of information recording by said magnetic head.

12. An apparatus according to claim 11, wherein said magnetic recording apparatus is used in a magnetooptical recording apparatus.

13. A magnetic head drive device for applying a magnetic field to a recording medium provided with a data region and a preformat region, said drive device comprising:

a pair of auxiliary coils;

a pair of switch elements respectively connected in series with said pair of auxiliary coils;

a magnetic head arranged between nodes of said pair of auxiliary coils and said pair of switch elements;

switch element drive means for driving said pair of switch elements, said switch element drive means controlling operation to maintain at least one of said pair of switch elements in an ON state during a period of suspending recording of information in the preformat region; and current control means for continuing to supply current to said pair of auxiliary coils during the period of suspending recording of information in the preformat region.

14. A magnetic recording apparatus for effecting recording of information on a recording medium provided with a data region and a preformat region, said apparatus comprising:

a magnetic head arranged near a surface of the recording medium;

a pair of auxiliary coils;

a pair of switch elements respectively connected in series with said pair of auxiliary coils;

switch element drive means for driving said pair of switch elements, said switch element drive means controlling operation to maintain at least one of said pair of switch elements in an ON state during a period of suspending recording of information in the preformat region by said magnetic head; and current control means for continuing to supply current to said pair of auxiliary coils during the period of suspending recording of information in the preformat region.

15. An apparatus according to claim 14, wherein said magnetic recording apparatus is used in a magnetooptical recording apparatus.

* * * * *

UNITED STATES PATENT AND TRADEMARK OFFICE
CERTIFICATE OF CORRECTION

PATENT NO. : 5,574,702
DATED : November 12, 1996
INVENTOR(S) : KAZUYOSHI ISHII

It is certified that error appears in the above-indentified patent and that said Letters Patent is hereby corrected as shown below:

<u>COLUMN 1</u>:

Line 39, "layer la" should read --layer 1a--.

Signed and Sealed this

Twenty-fifth Day of March, 1997

Attest:

BRUCE LEHMAN

*Attesting Officer*     *Commissioner of Patents and Trademarks*